US009058047B2

(12) United States Patent
Takahashi

(10) Patent No.: US 9,058,047 B2
(45) Date of Patent: Jun. 16, 2015

(54) SEMICONDUCTOR DEVICE

(75) Inventor: Yasuyuki Takahashi, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 263 days.

(21) Appl. No.: 13/207,780

(22) Filed: Aug. 11, 2011

(65) Prior Publication Data

US 2012/0049905 A1 Mar. 1, 2012

(30) Foreign Application Priority Data

Aug. 26, 2010 (JP) ................................ 2010-189141

(51) Int. Cl.
*H03L 7/00* (2006.01)
*G05F 3/30* (2006.01)

(52) U.S. Cl.
CPC ........................................ *G05F 3/30* (2013.01)

(58) Field of Classification Search
CPC .................................................. H03K 17/223
See application file for complete search history.

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,196,502 | B2 | 3/2007 | Sugiura et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |

(Continued)

FOREIGN PATENT DOCUMENTS

| | | | |
|---|---|---|---|
| CN | 001627224 | A | 6/2005 |
| CN | 002884287 | Y | 3/2007 |

(Continued)

OTHER PUBLICATIONS

Nakayama et al., "17a-TL-8 Effect of GaO Layer on IGZO-TFT Channel," Extended Abstracts (The 57th Spring Meeting 2010), The Japan Society of Applied Physics and Related Societies, Mar. 17, 2010, pp. 21-008.

(Continued)

*Primary Examiner* — Daniel Rojas
(74) *Attorney, Agent, or Firm* — Eric J. Robinson; Robinson Intellectual Property Law Office, P.C.

(57) ABSTRACT

Provided is a startup circuit which allows a reference voltage generating circuit to start up and reach a stable equilibrium state in an extremely short period. The startup circuit is configured to hold voltage which is substantially the same as internal voltage of the reference voltage generating circuit in the stable equilibrium state even when power is not supplied to the startup circuit. The voltage is output from the startup circuit to the reference voltage generation circuit when the reference voltage generating circuit is started.

16 Claims, 17 Drawing Sheets

(56) References Cited

U.S. PATENT DOCUMENTS

| | | | |
|---|---|---|---|
| 7,453,065 B2 | 11/2008 | Saito et al. | |
| 7,453,087 B2 | 11/2008 | Iwasaki | |
| 7,456,619 B2 | 11/2008 | Sasaki et al. | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,601,984 B2 | 10/2009 | Sano et al. | |
| 7,642,761 B2 | 1/2010 | Sasaki et al. | |
| 7,674,650 B2 | 3/2010 | Akimoto et al. | |
| 7,732,819 B2 | 6/2010 | Akimoto et al. | |
| 7,755,058 B2 * | 7/2010 | Maschke | 250/370.09 |
| 7,973,593 B2 | 7/2011 | Kitamura | |
| 7,994,500 B2 | 8/2011 | Kim et al. | |
| 8,021,917 B2 | 9/2011 | Akimoto et al. | |
| 8,058,645 B2 | 11/2011 | Jeong et al. | |
| 8,148,779 B2 | 4/2012 | Jeong et al. | |
| 8,188,480 B2 | 5/2012 | Itai | |
| 8,202,365 B2 | 6/2012 | Umeda et al. | |
| 8,203,143 B2 | 6/2012 | Imai | |
| 8,440,502 B2 | 5/2013 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0241735 A1 | 10/2007 | Rabeyrin et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0002114 A1 * | 1/2010 | Ogura et al. | 348/301 |
| 2010/0052643 A1 * | 3/2010 | Cho et al. | 323/313 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0320458 A1 | 12/2010 | Umeda et al. | |
| 2010/0320459 A1 * | 12/2010 | Umeda et al. | 257/43 |
| 2011/0193083 A1 | 8/2011 | Kim et al. | |
| 2011/0215328 A1 | 9/2011 | Morosawa et al. | |
| 2012/0119205 A1 | 5/2012 | Taniguchi et al. | |

FOREIGN PATENT DOCUMENTS

| | | | |
|---|---|---|---|
| CN | 101740398 | A | 6/2010 |
| EP | 1737044 | A | 12/2006 |
| EP | 2226847 | A | 9/2010 |
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-140842 | A | 5/2004 |
| JP | 2004-273614 | A | 9/2004 |
| JP | 2004-273732 | A | 9/2004 |
| JP | 2007-074022 | A | 3/2007 |
| JP | 2007-142698 | A | 6/2007 |
| JP | 2007-328680 | A | 12/2007 |
| JP | 2009-176237 | A | 8/2009 |
| JP | 2009-231613 | | 10/2009 |
| JP | 2010-016347 | | 1/2010 |
| JP | 4415062 | | 2/2010 |
| JP | 2010-067954 | | 3/2010 |
| JP | 2010-177431 | | 8/2010 |
| JP | 4571221 | | 10/2010 |
| JP | 2012-160679 | | 8/2012 |
| WO | WO-2004-114391 | | 12/2004 |
| WO | WO-2008/133345 | | 11/2008 |

OTHER PUBLICATIONS

Fortunato.E et al., "Wide-Bandgap High-Mobility ZNO Thin-Film Transistors Produced at Room Temperature,", Appl. Phys. Lett. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

(56) References Cited

OTHER PUBLICATIONS

Ikeda.T et al., "Full-Functional System Liquid Crystal Display Using CG-Silicon Technology,", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors,", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.
Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters) , Jun. 17, 1996, vol. 68, No. 25, pp. 3650-3652.
Nakamura.M et al., "The phase relations in the In2O3-Ga2ZnO4-ZnO system at 1350°C,", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.
Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.
Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector with Suppressed Voltage Loss for White Tandem OLEDS,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Emplying MOO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits, 2008, vol. 43, No. 1, pp. 292-299.
Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:AL and SN-Doped Zinc Indium Oxide Thin Film transistors for AMOLED Back-Plane,", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.
Sakata.J et al., "Development of 4.0-IN. AMOLED Display with Driver Circuit Using Amorphous IN-GA-ZN-Oxide TFTS,", IDW '09 : Proceedings of the 16th International Display Workshops, 2009, pp. 689-692.
Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by Peald Grown ZNO TFT,", IMID '07 Digest , 2007, pp. 1249-1252.
Godo.H et al., "Temperature Dependence of Characteristics and Electronic Structure for Amorphous IN-GA-ZN-Oxide TFT,", AM-FPD '09 Digest of Technical Papers, Jul. 1, 2009, pp. 41-44.
Osada.T et al., "Development of Driver-Integrated Panel Using Amorphous IN-GA-ZN-Oxide TFT,", AM-FPD '09 Digest of Technical Papers, Jul. 1, 2009, pp. 33-36.
Hirao.T et al., "Novel Top-Gate Zinc Oxide Thin-Film Transistors (ZNO TFTS) for AMLCDS,", Journal of the SID, 2007, vol. 15, No. 1, pp. 17-22.
Hosono.H, "68.3:Invited Paper:Transparent Amorpous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous IN-GA-ZN-Oxide TFT,", SID Digest '09 : SID International Symposium Digest of Technical Papers, May 31, 2009, pp. 1110-1112.
Ohara.H et al., "21.3:4.0 IN. QVGA AMOLED Display Using IN-GA-ZN-Oxide TFTS with a Novel Passivation Layer,", SID Digest '09 : SID International Symposium Digest of Technical Papers, May 31, 2009, pp. 284-287.
Miyasaka.M, "SUFTLA Flexible Microelectronics on Their Way to Business,", SID Digest '07 : SID International Symposium Digest of Technical Papers, 2007, vol. 38, pp. 1673-1676.

(56) References Cited

OTHER PUBLICATIONS

Chern.H et al., "An Analytical Model for the Above-Threshold Characteristics of Polysilicon Thin-Film Transistors,", IEEE Transactions on Electron Devices, Jul. 1, 1995, Vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1:Polyarizer-Free Reflective LCD Combined with Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED , ", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M, "Synthesis of Homolgous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 1, 2002, vol. 1, pp. 64-68.
Kimizuka.N et al., "Spinel,YBFE2O4, and YB2FE3O7 Types of Structures for Compounds in the IN2O3 and SC2O3-A2O3-BO Systems [A; FE, GA, or AL; B: MG, MN, FE, NI, CU, or ZN] at Temperatures over 1000°C,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display, ", SID Digest '08 : SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", JPN. J. Appl. Phys. (Japanese Journal of Applied Physics) , 2006, vol. 45, No. 5B, pp. 4303-4308.
Janotti.A et al., "Native Point Defects IN ZnO,", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies In ZnO,", Appl. Phys. Lett. (Applied Physics Letters) , 2005, vol. 87 , pp. 122102-1-122102-3.
Oba.F et al., "Defect energetics in ZnO: A hybrid Hartree-Fock density functional study,", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW '08 : Proceedings of the 6th International Display Workshops, Dec. 3, 2008, pp. 581-584.
Kim.S et al., "High-Performance oxide thin film transistors passivated by various gas plasmas,", 214TH ECS Meeting, 2008, No. 2317, ECS.
Clark. S et al., "First Principles Methods using CASTEP,", Zeitschrift fur Kristallographie, 2005, vol. 220, pp. 567-570.
Lany.S et al., "Dopability, Intrinsic Conductivity, and Nonstoichiometry of Transparent Conducting Oxides, ", Phys. Rev. Lett. (Physical Review Letters), Jan. 26, 2007, vol. 98, pp. 0455010-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of ZNO Thin-Film Transistors with Aluminum Oxide Dielectric Layers,", J. Electrochem. SOC. (Journal of the Electrochemical Society), 2008, vol. 155, No. 12, pp. H1009-H1014.
Ueno.K et al., "Field Effect Transistor on SrTiO3 with Sputtered Al2O3 Gate Insulator,", Appl. Phys. Lett. (Applied Physics Letters) , Sep. 1, 2003, vol. 83, No. 9, pp. 1755-1757.
Baker.R. J, "20.1.3 Biasing the Current Mirror,", CMOS Circuit Design, Layout, and Simulation Second Edition, Nov. 9, 2007, pp. 621-626, IEEE Press.
Chinese Office Action (Application No. 201110257326.9) Dated Jul. 25, 2014.

* cited by examiner

Prior Art

SEMICONDUCTOR DEVICE

BACKGROUND OF THE INVENTION

1. Field of the Invention

The present invention relates to a semiconductor device using a semiconductor element.

2. Description of the Related Art

In general, the output of an analog circuit is required to be highly accurate and stable regardless of fluctuation in power supply voltage or the like, and thus stable reference voltage is needed in many cases. A reference voltage generating circuit for generating such stable reference voltage is known. As reference voltage generating circuits, a variety of circuits of a threshold voltage-based type, a β multiplier self-bias type, a bandgap-based type, and the like are known. Most of these reference voltage generating circuits are driven by being supplied with slight current.

However, when power supply voltage is simply input to such a reference voltage generating circuit at the time of startup thereof, the reference voltage generating circuit is not started up properly in some cases. Specifically, in some cases, even when power supply voltage is input, the reference voltage generating circuit still exits in a stable state where current does not flow in the circuit, and therefore the circuit is not started up or it takes a significantly long time for the circuit to reach a stable equilibrium state even if the circuit is started up. Thus, a method is known in which a startup circuit for applying initial voltage that prompts startup of a reference voltage generating circuit when power is input is connected thereto in order to achieve quick startup of the reference voltage generating circuit (Non-Patent Document 1).

FIG. 8 illustrates an example of a configuration of a β multiplier self-bias reference voltage generating circuit to which a conventional startup circuit is connected. A startup circuit 501 includes a transistor 511, a transistor 512, and a transistor 513. A first electrode of the transistor 511 is connected to a power input portion VDD, and a second electrode and a gate of the transistor 511 are connected to a first electrode of the transistor 512 and a gate of the transistor 513. A gate of the transistor 512 is connected to a second electrode of the transistor 513, and a second electrode of the transistor 512 is connected to a ground voltage input portion GND. Here, a node connected to the gate of the transistor 511 is referred to as a node (a).

A reference voltage generating circuit 502 includes a transistor 521, a transistor 522, a transistor 523, a transistor 524, and a resistor 525. A first electrode of the transistor 521 is connected to the power input portion VDD, and a gate and a second electrode of the transistor 521 are connected to a gate of the transistor 522 and a first electrode of the transistor 523. A first electrode of the transistor 522 is connected to the power input portion VDD, and a second electrode of the transistor 522 is connected to a gate of the transistor 523 and a first electrode and a gate of the transistor 524. A second electrode of the transistor 523 is connected to a first electrode of the resistor 525. A second electrode of the resistor 525 and a second electrode of the transistor 524 are connected to the ground voltage input portion GND. Here, a node connected to the gates of the transistor 521 and the transistor 522 is referred to as a node (b), and a node connected to the gates of the transistor 523 and the transistor 524 is referred to as a node (c). Note that the node (c) corresponds to a node of an output portion OUT.

A first electrode and the second electrode of the transistor 513 in the startup circuit are connected to the node (b) and the node (c), respectively, so that the startup circuit 501 and the reference voltage generating circuit 502 are electrically connected to each other.

Note that the transistor 511, the transistor 521, and the transistor 522 are each a p-channel transistor, and the transistor 512, the transistor 513, the transistor 523, and the transistor 524 are each an n-channel transistor. In this configuration, a load capacitor 531 is connected as an output load.

Power supply voltage $V_{dd}$ is applied to the power input portion VDD. When power is not supplied, the power input portion VDD can be in a floating state or supplied with ground voltage $V_{gnd}$. Further, the ground voltage $V_{gnd}$ is input to the ground voltage input portion GND. Here, voltage lower than the power supply voltage $V_{dd}$ can be used instead of the ground voltage $V_{gnd}$. For example, common voltage which is common to the circuits or 0 V can be used as the ground voltage $V_{gnd}$. The ground voltage input portion GND may be set at low power supply voltage. Note that the low power supply voltage is voltage which is lower than high power supply voltage when the high power supply voltage used for the power input portion VDD is a reference. In this configuration, the ground voltage $V_{gnd}$ is applied to the ground voltage input portion GND.

Next, operation of the startup circuit 501 and the reference voltage generating circuit 502 will be described.

First, before power is input, that is, when the power supply voltage $V_{dd}$ is not applied to the power input portion VDD, current does not flow into the transistor 521, the transistor 522, the transistor 523, the transistor 524, and the resistor 525 in the reference voltage generating circuit 502. Here, the state where all the transistors are in an off state and current does not flow thereinto is one of metastable states of the reference voltage generating circuit 502.

Next, the power supply voltage $V_{dd}$ is applied to the power input portion VDD. However, since the reference voltage generating circuit 502 is stabilized in the metastable state, the reference voltage generating circuit 502 operates to keep this state even when the power supply voltage $V_{dd}$ is applied to the power input portion VDD. In other words, right after the power supply voltage $V_{dd}$ is applied to the power input portion VDD, the voltage of the node (b) connected to the gates of the transistor 521 and the transistor 522 becomes $V_{dd}$ so that a voltage difference is not generated between the gate and the source of each of the transistor 521 and the transistor 522, whereby the off state of the transistors is maintained. In a similar manner, the voltage of the node (c) connected to the gates of the transistor 523 and the transistor 524 becomes the ground voltage $V_{gnd}$ so that the transistor 523 and the transistor 524 are in the off state.

Meanwhile, in the startup circuit 501, when the power supply voltage $V_{dd}$ is applied to the power input portion VDD, the voltage of the node (a) connected to the gate of the transistor 511 is changed from $V_{dd}$ to voltage between $V_{dd}$ and $V_{thp}$ (here, $V_{thp}$ is the threshold voltage of each p-channel transistor). Thus, a voltage difference is generated between the gate of transistor 513 connected to the node (a) and the second electrode thereof, the transistor 513 is turned on, and current flows from the node (b) toward the node (c). Accordingly, the voltage of the first electrode of the transistor 513, that is, the voltage of the node (b) drops from the power supply voltage $V_{dd}$; at the same time, the voltage of the second electrode of the transistor 513, that is, the voltage of the node (c) rises from the ground voltage $V_{gnd}$.

In the reference voltage generating circuit 502, the voltage of the node (b) drops from $V_{dd}$, which allows the transistor 521 and the transistor 522 to be turned on; at the same time, the voltage of the node (c) rises from the ground voltage $V_{gnd}$, which allows the transistor 523 and the transistor 524 to be turned on. Consequently, the reference voltage generating circuit 502 leaves from the metastable state where current does not flow and starts operating.

On the other hand, a rise in the voltage of the node (c) allows the transistor 512 whose gate is connected to the node (c) to be turned on. Accordingly, current flows through the transistor 512 so that the voltage of the node (a) drops to the ground voltage $V_{gnd}$ and thus the transistor 513 is turned off. When the transistor 513 is turned off, current flowing from the node (b) to the node (c) as described above is blocked and the startup circuit 501 is completely electrically isolated from the reference voltage generating circuit 502.

After that, the reference voltage generating circuit 502 reaches a stable equilibrium state. In other words, the voltage of the node (b) drops from $V_{dd}$ and then reaches to certain voltage higher than or equal to the ground voltage $V_{gnd}$ and lower than or equal to the power supply voltage $V_{dd}$ and is stabilized; in a similar manner, the voltage of the node (c) rises from the ground voltage $V_{gnd}$ and then reaches certain voltage higher than or equal to the ground voltage $V_{gnd}$ and lower than or equal to the power supply voltage $V_{dd}$ and is stabilized. Here, the voltage of the node (c) corresponds to output voltage of the reference voltage generating circuit 502.

In this manner, when power is input, the startup circuit functions to input voltage which allows the reference voltage generating circuit to leave from a metastable state and prompts startup thereof to the reference voltage generating circuit.

REFERENCE

Non-Patent Document

[Non-Patent Document 1] R. Jacob Baker (2005), CMOS Circuit Design, Layout, and Simulation. Second Edition, (IEEE Press), p. 625

SUMMARY OF THE INVENTION

However, a reference voltage generating circuit to which such a conventional startup circuit is connected has a problem in that it takes a long time to stabilize the output voltage after input of power supply voltage to the reference voltage generating circuit.

Therefore, an object of one embodiment of the present invention is to provide a circuit with which a period from input of power supply voltage to a reference voltage generating circuit to the time when the reference voltage generating circuit reaches a stable equilibrium state is shortened.

In order to achieve the above object, one embodiment of the present invention focuses on initial voltage output from a startup circuit.

Initial voltage (hereinafter also referred to as initial voltage $V_0$) output from the startup circuit is slightly lower than the power supply voltage $V_{dd}$ or slightly higher than the ground voltage $V_{gnd}$. However, in the reference voltage generating circuit, the time taken for the voltage of an input node to which the initial voltage $V_0$ output from the startup circuit is input to reach voltage (hereinafter also referred to as voltage $V_{sta}$) of the input node in a stable equilibrium state (hereinafter such time is also referred to as startup time) is prolonged as the difference between the input initial voltage $V_0$ and $V_{sta}$ is increased.

Therefore, in order to shorten the period from input of power to the time when the reference voltage generating circuit reaches a stable equilibrium state, the initial voltage $V_0$ input from the startup circuit to the reference voltage generating circuit may be set to voltage close to the internal voltage $V_{sta}$ of the reference voltage generating circuit in a stable equilibrium state. Further, the startup circuit may be configured to hold such voltage even when power is not supplied and to output the voltage at the time of startup.

That is, one embodiment of the present invention is a semiconductor device including a transistor whose first electrode is electrically connected to a capacitor and whose second electrode is electrically connected to a reference voltage generating circuit, and a control circuit electrically connected to a gate of the transistor. The control circuit turns off the transistor before the reference voltage generating circuit stops operating so that voltage input to the second electrode of the transistor is held in a node between the first electrode of the transistor and the capacitor, and turns on the transistor at the time of startup of the reference voltage generating circuit so that the voltage held in the node is output to the second electrode of the transistor.

One of a source and a drain of a transistor included in a startup circuit is connected to one electrode of a capacitor, the other of the source and the drain is electrically connected to a node of an input portion of the reference voltage generating circuit (hereinafter also referred to as an input node), and the transistor is controlled by a control circuit connected to a gate of the transistor. A storage node between the transistor and the capacitor can hold voltage close to internal voltage of the reference voltage generating circuit in a stable equilibrium state, specifically, voltage close to the voltage $V_{sta}$ of the input node in a stable equilibrium state. The control circuit turns on the transistor when the reference voltage generating circuit operates and is in a stable equilibrium state, and turns off the transistor right before the reference voltage generating circuit stops operating, whereby voltage close to $V_{sta}$ can be held in the storage node.

In the case where power is input again to start up the reference voltage generating circuit while the voltage close to the voltage $V_{sta}$ is held in the storage node, when the control circuit turns on the transistor, the voltage of the input node of the reference voltage generating circuit is instantly raised to voltage close to $V_{sta}$ by the voltage held in the storage node; thus, the reference voltage generating circuit can reach a stable equilibrium state in an extremely short time. Such configuration and method can extremely shorten the period from input of power to the time when the reference voltage generating circuit reaches a stable equilibrium state.

One embodiment of the present invention is a semiconductor device in which a semiconductor material included in a channel of the transistor includes an oxide semiconductor material.

One embodiment of the present invention is a semiconductor device in which the current density per micrometer of a channel width is 100 yA/μm or lower when the transistor is in an off state.

The channel of the transistor connected to the storage node can be formed using a semiconductor material including an oxide semiconductor. With the transistor using a semiconductor layer including an oxide semiconductor, leakage current in an off state can be extremely low and voltage can be held in the storage node for a longer time; accordingly, a startup circuit for a reference voltage generating circuit, which can operate even when power is not supplied for a long time, can be provided.

One embodiment of the present invention is a semiconductor device in which power supply to the reference voltage generating circuit is controlled.

Power supply voltage input to the reference voltage generating circuit is controlled by the control circuit in the startup circuit. With such a configuration, the control circuit can stop power supply to the reference voltage generating circuit even when power is input, and thus the reference voltage generating circuit can be made inactive when not needed; accordingly, unnecessary power consumption can be suppressed and a reference voltage generating circuit which is driven with low power can be realized.

One embodiment of the present invention is a semiconductor device in which the capacitance of the capacitor is higher than the capacitance of a load capacitor connected to the reference voltage generating circuit.

The maximum value $V_{0max}$ of the initial voltage $V_0$ which can be output from the startup circuit according to one embodiment of the present invention is determined by a relation between the capacitance of the capacitor connected to the storage node and the load capacitance which is the sum of the capacitance of the reference voltage generating circuit and the capacitance of a capacitor connected to an output portion of the reference voltage generating circuit. For example, in the case where the capacitance of the capacitor connected to the storage node is denoted by $C_f$, the load capacitance is denoted by $C_L$, the voltage held in the storage node is equal to $V_{sta}$, and the initial voltage of the input node is equal to the ground voltage $V_{gnd}$, the maximum value $V_{0max}$ of the initial voltage is $V_{sta}\times(C_f/(C_f+C_L))$. Thus, as the ratio of $C_f$ to $C_L$ increases, the initial voltage $V_0$ which is output to the input node of the reference voltage generating circuit can become closer to $V_{sta}$ and the startup time of the reference voltage generating circuit can be shorter. Here, at least $C_f$ is larger than $C_L$, whereby voltage higher than a half of $V_{sta}$ can be input to the input node and the startup time of the reference voltage generating circuit can be sufficiently shortened. A similar effect can be obtained when the initial voltage of the input node is equal to $V_{dd}$ and voltage lower than $V_{dd}$ is output to the input node as the initial voltage $V_0$.

According to one embodiment of the present invention, a circuit can be provided with which a period from input of power supply voltage to a reference voltage generating circuit to the time when the reference voltage generating circuit reaches a stable equilibrium state is shortened.

BRIEF DESCRIPTION OF THE DRAWINGS

In the accompanying drawings:

FIG. 8 illustrates a configuration of a conventional startup circuit for a reference voltage generating circuit and the like;

DETAILED DESCRIPTION OF THE INVENTION

Figure 1:
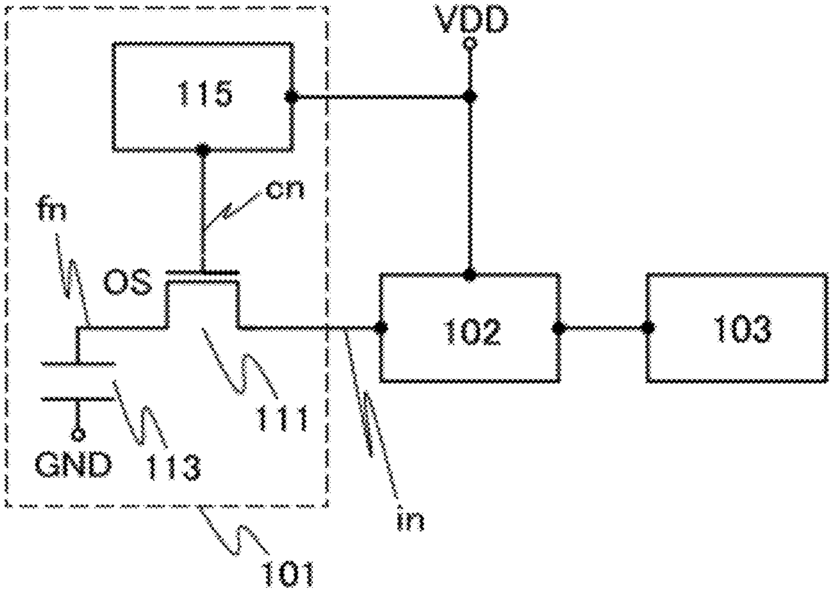
FIG. 1 illustrates a configuration of a startup circuit for a reference voltage generating circuit and the like, which is one embodiment of the present invention.

Embodiments will be described in detail with reference to drawings. Note that the present invention is not limited to the following description, and it is easily understood by those skilled in the art that the mode and detail can be changed in various ways without departing from the spirit and scope of the present invention. Therefore, the present invention is not construed as being limited to the description of the following embodiments. Note that in the structures of the invention described below, the same portions or portions having similar functions are denoted by the same reference numerals in different drawings, and description of such portions is not repeated.

Note that in each drawing described in this specification, the size, the layer thickness, or the region of each component is exaggerated for clarity in some cases. Therefore, embodiments of the present invention are not limited to such scales.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT).

Note that in a circuit diagram or block diagram used in this specification, "OS" may be written specially beside a transistor to clarify that an oxide semiconductor is used for a semiconductor layer of the transistor.

Functions of a "source" and a "drain" are sometimes replaced with each other when a transistor of opposite polarity is used or when the direction of current flow is changed in circuit operation, for example. Therefore, the terms "source" and "drain" can be used to denote the drain and the source, respectively, in this specification.

In this specification, one of a source and a drain of a transistor is called a "first electrode", and the other of the source and the drain is called a "second electrode" in some cases. Note that a gate is referred to as a "gate" or a "gate electrode".

Note that in this specification, the term "electrically connected" includes the case where components are connected through an object having any electric function. There is no particular limitation on an object having any electric function as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

Note that a node in this specification and the like means an element (e.g., a wiring) which enables electric connection between elements included in a circuit. Therefore, a "node to which A is connected" is a wiring which is electrically connected to A and can be regarded as having the same potential as A. Note that even when the one or more elements (e.g., a switch, a transistor, a capacitor, an inductor, a resistor, or a diode) which enable electric connection is/are inserted in the wiring, a portion on the wiring which is connected to a terminal of the element(s) on a side opposite to A can be regarded as the "node to which A is connected" as long as the portion has the same potential as A.

Embodiment 1

In this embodiment, a configuration and operation of a startup circuit for a reference voltage generating circuit, which includes a transistor including an oxide semiconductor in a semiconductor layer and a capacitor in combination, will be described with reference to FIG. 1 and FIG. 2.

<Example of Circuit Configuration>

FIG. 1 is a block diagram illustrating connection among a startup circuit of this embodiment, a reference voltage generating circuit connected thereto, and a load circuit connected to an output portion of the reference voltage generating circuit.

A reference voltage generating circuit 102 has two input portions connected to a power input portion VDD and a startup circuit 101, and an output portion connected to a load circuit 103. Reference voltage $V_{ref}$ appears at the output portion of the reference voltage generating circuit. As the reference voltage generating circuit 102, a variety of circuits for generating reference voltage can be used; for example, a threshold voltage-based reference voltage generating circuit which utilizes the threshold voltage of a transistor, a β multiplier self-bias reference voltage generating circuit which is developed from the threshold voltage-based reference voltage generating circuit, a bandgap-based reference voltage generating circuit, and the like are given.

The load circuit 103 is connected to the output portion of the reference voltage generating circuit 102, and operates by utilizing the reference voltage output from the reference voltage generating circuit 102. There is no particular limitation on the load circuit as long as a circuit which utilizes the reference voltage is used. Examples of the load circuit 103 include an amplifier circuit, a power supply circuit, an arithmetic circuit, and the like.

The startup circuit 101 includes a control circuit 115, a transistor 111, and a capacitor 113.

A gate of the transistor 111 is connected to the control circuit 115, a first electrode of the transistor 111 is connected to a first electrode of the capacitor 113, and a second electrode of the transistor 111 is connected to the input portion of the reference voltage generating circuit 102. A second electrode of the capacitor 113 is connected to a ground voltage input portion GND.

The control circuit 115 can control the on/off state of the transistor 111 by transmitting a control signal to the gate of the transistor 111. In the case of turning on the transistor 111, for example, power supply voltage $V_{dd}$ can be input to the gate of the transistor 111. In the case of turning off the transistor 111, for example, ground voltage $V_{gnd}$ can be input to the gate of the transistor 111. The output voltage of the control circuit 115 is not limited to the above voltages, and any voltage that allows the transistor 111 to be completely turned on or off may be output. In this embodiment, for output of the control circuit, $V_{dd}$ is output to turn on the transistor 111 and the ground voltage $V_{gnd}$ is output to turn off the transistor 111.

A node where the first electrode of the transistor 111 and the first electrode of the capacitor 113 are connected to each other is referred to as a storage node (fn), and a node where the second electrode of the transistor 111 and the input portion of the reference voltage generating circuit 102 are connected to each other is referred to as an input node (in). A node where the control circuit 115 and the gate of the transistor 111 are connected to each other is referred to as a control node (cn). Here, when sufficiently high voltage is input to the gate of the transistor 111 and linear operation thereof is secured, the storage node (fn) and the input node (in) can be at the same voltage. After that, when the transistor 111 is completely turned off, the storage node (fn) holds the voltage which is the same as the voltage before the transistor 111 is turned off.

The transistor 111 can be an n-channel transistor including an oxide semiconductor in a semiconductor layer where a channel is formed. A transistor including an oxide semiconductor in a semiconductor layer, which is manufactured using proper materials through a proper process as described in a subsequent embodiment, can have extremely low leakage current in an off state. By using such a transistor as the transistor 111, an influence of voltage drop due to leakage current of the transistor can be reduced and the voltage of the storage node (fn) can be held for a long time.

In a transistor including an oxide semiconductor, the density of leakage current between a source and a drain per micrometer of a channel width in an off state (off-state current density) can be 10 zA/μm ($1\times10^{-20}$ A/μm) or lower, 1 zA/μm ($1\times10^{-21}$ A/μm) or lower, or 100 yA/μm ($1\times10^{-22}$ A/μm) or lower at a source-drain voltage of 3.0 V at operating temperature (e.g., 25° C.).

<Example of Circuit Operation>

Next, operation of the startup circuit 101 and the reference voltage generating circuit 102 in FIG. 1 will be described with reference to a timing chart of FIG. 2.

Figure 2:
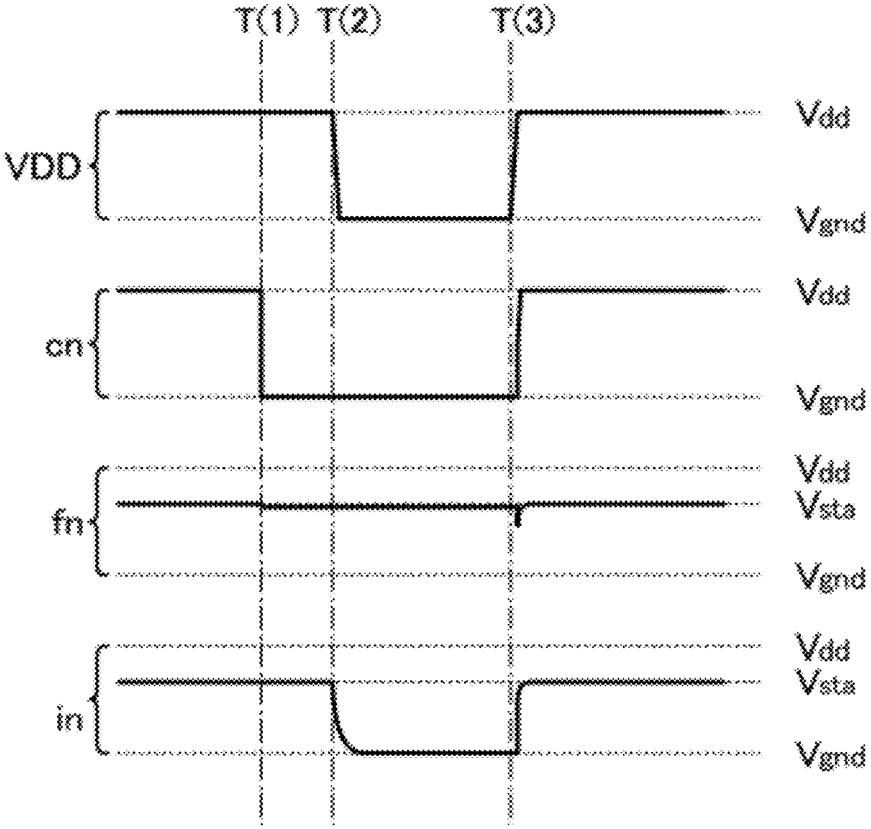
FIG. 2 is a timing chart of a startup circuit for a reference voltage generating circuit and the like, which is one embodiment of the present invention.

FIG. 2 is a timing chart showing the voltages of the power input portion VDD, the control node (cn), the storage node (fn), and the input node (in) in the circuit illustrated in FIG. 1. In FIG. 2, the vertical axis represents voltage and the horizontal axis represents time. In this embodiment, operation in the following case will be described: the reference voltage generating circuit 102 operates in a stable equilibrium state before time T(1) shown in FIG. 2, power supply is stopped at time T(2), and then power is input again at time T(3).

In the state before time T(1) of FIG. 2, that is, when the reference voltage generating circuit 102 operates in a stable equilibrium state, the voltage of the power input portion VDD and the voltage of the control node (cn), which is supplied from the control circuit 115, are both the power supply voltage $V_{dd}$. Since the reference voltage generating circuit 102 operates in a stable equilibrium state, the voltage of the input node (in) is maintained at $V_{sta}$ which is voltage in a stable equilibrium state. Further, since the voltage of the control node (cn) is $V_{dd}$, the transistor 111 is turned on to conduct electricity, so that the storage node (fn) has the same voltage as the input node (in), that is, $V_{sta}$. Here, the difference between $V_{dd}$ and $V_{sta}$ is sufficiently larger than the threshold voltage of the transistor 111. In other words, the transistor 111 operates in a linear region, and an influence of the threshold voltage of the transistor 111 is negligible.

First, at time T(1) preceding time T(2) at which power supply is stopped, the voltage of the control node (cn) is set to the ground voltage $V_{gnd}$. Accordingly, the transistor 111 is turned off. Here, the storage node (fn) still holds $V_{sta}$. Note that as shown in FIG. 2, the voltage held in the storage node (fn) may be lower than $V_{sta}$ owing to an influence of gate capacitance of the transistor 111.

Next, power supply is stopped at time T(2). At this time, the voltage of the power input portion VDD drops from the power supply voltage $V_{dd}$ to the ground voltage $V_{gnd}$. When power supply from the power input portion VDD is stopped, the reference voltage generating circuit 102 stops operating and the internal voltage of the circuit drops. Accordingly, the voltage of the input node (in) drops to the ground voltage $V_{gnd}$. On the other hand, as for the storage node (fn), the voltage of the storage node (fn) does not drop and is held almost unchanged because the transistor 111 is in an off state and leakage current of the transistor 111 in an off state is extremely low.

Here, a period from time T(2) to time T(3) corresponds to a period during which power is not supplied. During the period, a power source for the startup circuit 101 and the reference voltage generating circuit 102 is inactive. However, the voltage held in the storage node (fn) is maintained at an almost constant level for a long time without dropping.

After that, power is input again at time T(3), and the voltage of the power input portion VDD rises to $V_{dd}$. When the power supply voltage rises to voltage at which the control circuit 115 can operate, the control circuit 115 outputs $V_{dd}$ as output voltage to the gate of the transistor 111, so that the transistor 111 is turned on. When the transistor 111 is turned on, current flows from the storage node (fn) at higher voltage toward the input node (in) and the voltage of the input node (in) instantly rises to voltage close to $V_{sta}$ in an extremely short time.

Here, the startup time which is a period from input of power to the reference voltage generating circuit 102 to the time when the reference voltage generating circuit 102 reaches a stable equilibrium state becomes shorter as the difference between initial voltage input to the input node (in) and the voltage $V_{sta}$ of the input node (in) in a stable equilibrium state becomes smaller. Therefore, by instantly raising the voltage of the input node (in) to $V_{sta}$ with the use of the voltage held in the storage node (fn) as described above, the startup time of the reference voltage generating circuit 102 can be extremely short.

Note that the voltage of the input node (in) that appears just after the transistor 111 is turned on at time T(3) is determined by a relation between the capacitance of the capacitor 113 and the load capacitance which is the sum of the capacitance of the reference voltage generating circuit 102 and the capacitance of the load circuit connected to the output portion of the reference voltage generating circuit. As shown in FIG. 2, in the case where the load capacitance is not negligible with respect to the capacitance of the capacitor 113, voltage of the input node fn and voltage of the storage node fn are lower than the voltage held in the storage node fn at a moment when the transistor 111 is turned on to obtain electrical conduction between the storage node fn and the input node. For example, in the case where the capacitance of the capacitor 113 is sufficiently higher than the load capacitance, the voltage of the input node (in) rises at time T(3) to voltage substantially equal to the voltage held in the storage node (fn). When the capacitance of the capacitor 113 is at least higher than the load capacitance, the input node (in) can have voltage close to a half of $V_{sta}$; consequently, the startup time of the reference voltage generating circuit 102 can be sufficiently short.

Note that one embodiment of the present invention is not limited to the circuit configuration described in this embodiment. For example, a switch, a resistor, a capacitor, a transistor, a logic circuit, or the like may be added to the circuit described in this embodiment.

The startup circuit and the reference voltage generating circuit are directly connected to each other in this embodiment; however, one embodiment of the present invention is not limited to this. An additional circuit or element may be connected between the startup circuit and the reference voltage generating circuit as long as electrical connection is possible between the input node of the reference voltage generating circuit and the storage node in the startup circuit. For example, a transistor, an analog switch, a feedback operational amplifier, a bidirectional buffer circuit, or the like may be connected therebetween.

The startup circuit for the reference voltage generating circuit described in this embodiment includes the capacitor and the transistor with extremely low leakage current in an off state, whereby the voltage of the input node in a stable equilibrium state of the reference voltage generating circuit can be held in the storage node even when power is not supplied and voltage close to the voltage in a stable equilibrium state can be instantly output to the input node when power is input again. Accordingly, the startup time of the reference voltage generating circuit can be extremely short.

This embodiment can be implemented in an appropriate combination with any of the other embodiments described in this specification.

Embodiment 2

In this embodiment, a configuration and operation of a startup circuit for a reference voltage generating circuit, which has a configuration different from that described in Embodiment 1, will be described with reference to FIG. 3 and FIG. 4.

<Example of Circuit Configuration>

Figure 3:
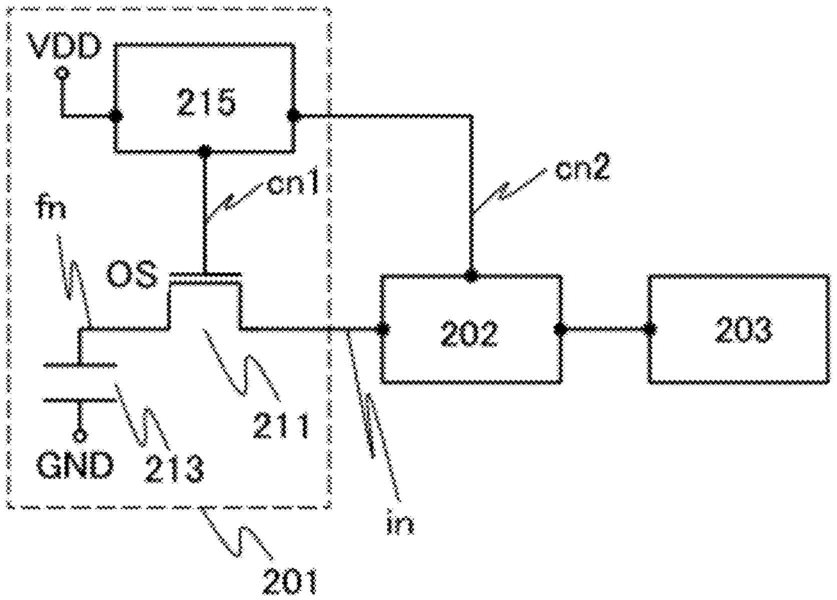
FIG. 3 illustrates a configuration of a startup circuit for a reference voltage generating circuit and the like, which is one embodiment of the present invention.

FIG. 3 is a block diagram illustrating connection between a load circuit and a reference voltage generating circuit to which a startup circuit of this embodiment having a configuration different from that described in Embodiment 1 is connected.

In the reference voltage generating circuit 102 described in Embodiment 1, the input portion thereof is connected to the power input portion VDD. On the other hand, a reference voltage generating circuit 202 is connected to the power input portion VDD through a control circuit 215 in a startup circuit 201. Note that as a circuit that can be used as the reference voltage generating circuit 202, any of the reference voltage generating circuits given in Embodiment 1 can be used as appropriate.

As a load circuit 203, as in Embodiment 1, a circuit which is driven with the use of the reference voltage $V_{ref}$ output from the reference voltage generating circuit 202 can be used as appropriate.

The startup circuit 201 has the same configuration as the startup circuit 101 except that it includes the control circuit 215 which is different from the control circuit 115 described in Embodiment 1.

The control circuit 215 is connected to the power input portion VDD and controls both a transistor 211 and the reference voltage generating circuit 202. As a control signal for the transistor 211, a control signal similar to that of the control circuit 115 described in Embodiment 1 can be used. In addition, the control circuit 215 can control the operating/non-operating state of the reference voltage generating circuit 202 by outputting a control signal corresponding to power supply voltage for the reference voltage generating circuit 202. For example, in order to keep the reference voltage generating circuit 202 from operating while the power supply voltage $V_{dd}$ is input to the power input portion VDD, the ground voltage $V_{gnd}$ is output to the reference voltage generating circuit 202 as the control signal; in order to make the reference voltage generating circuit 202 operate, the power supply voltage $V_{dd}$ is output.

Here, a node connected between the control circuit 215 and the transistor 211 is referred to as a control node (cn1), and a node connected between the control circuit 215 and the reference voltage generating circuit 202 is referred to as a control node (cn2).

The startup circuit 201 has a configuration in which, even after power is input, power supply to the reference voltage generating circuit 202 can be stopped when not needed. In other words, the startup circuit 201 can control power input to the reference voltage generating circuit 202. With the startup circuit 201 having such a configuration, the reference voltage generating circuit 202 can operate with low power.

<Example of Circuit Operation>

Next, operation of the startup circuit 201 and the reference voltage generating circuit 202 will be described with reference to a timing chart of FIG. 4.

Figure 4:
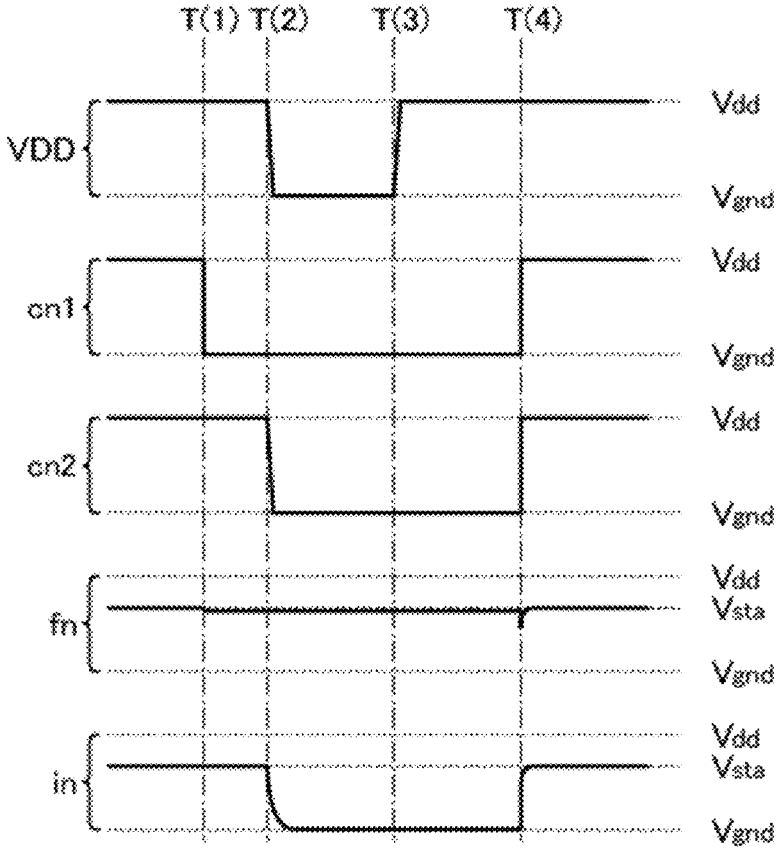
FIG. 4 is a timing chart of a startup circuit for a reference voltage generating circuit and the like, which is one embodiment of the present invention.

FIG. 4 is a timing chart showing the voltages of the power input portion VDD, the two control nodes (the control node (cn1) and the control node (cn2)), the storage node (fn), and the input node (in) in the circuit illustrated in FIG. 3. In FIG. 4, the vertical axis represents voltage and the horizontal axis represents time. In this embodiment, operation in the following case will be described: the reference voltage generating circuit 202 operates in a stable equilibrium state before time T(1) shown in FIG. 4, power supply is stopped at time T(2) shown in FIG. 4, and then power is input again at time T(3).

In the states before time T(1) of FIG. 4, that is, when the reference voltage generating circuit 202 operates in a stable equilibrium state, the voltage of the power input portion VDD and the voltages of the two control nodes (cn1) and (cn2) are all the power supply voltage $V_{dd}$. Since the reference voltage generating circuit 202 operates in a stable equilibrium state, the voltage of the input node (in) is stabilized at $V_{sta}$. The voltage of the storage node (fn) is also $V_{sta}$ because the transistor 211 is in an on state. Here, the difference between $V_{dd}$ and $V_{sta}$ is sufficiently larger than the threshold voltage of the transistor 211 as in Embodiment 1, operation of the transistor 211 in a linear region is secured, and an influence of the threshold voltage of the transistor 211 is negligible.

In a manner similar to that described in Embodiment 1, in order to turn off the transistor 211 at time T(1) preceding time T(2) at which power supply is stopped, the voltage of the control node (cn1) is set to the ground voltage $V_{gnd}$. Accordingly, voltage close to $V_{sta}$ is held in the storage node (fn).

After that, power supply is stopped at time T(2); at the same time, the output voltage of the control circuit 215 to the reference voltage generating circuit 202 drops, so that the voltage of the control node (cn2) drops from the power supply voltage $V_{dd}$ to the ground voltage $V_{gnd}$. Meanwhile, the transistor 211 remains in an off state where leakage current is extremely low, and thus the voltage of the storage node (fn) is held for a long time without dropping. Here, a period from time T(2) to time T(3) is a period during which power is not supplied.

Next, power is input again at time T(3). The voltage of the power input portion VDD rises to the power supply voltage $V_{dd}$. At this point, voltage is not supplied from the control circuit 215 to the reference voltage generating circuit 202, and the voltage of the control node (cn2) is still the ground voltage $V_{gnd}$. Further, voltage is not supplied from the control circuit 215 to the transistor 211, either; therefore, the transistor 211 remains in an off state and the voltage held in the storage node (fn) is maintained. Accordingly, in a period from time T(3) to time T(4), the reference voltage generating circuit 202 can be kept from operating even after power is input, and thus unnecessary power consumption can be suppressed.

At time T(4), in order to start up the reference voltage generating circuit 202, the control circuit 215 outputs the power supply voltage $V_{dd}$ to the transistor 211 and the reference voltage generating circuit 202. Since power has already been input, the voltage of the control node (cn1) and the voltage of the control node (cn2) instantly rise to the power supply voltage $V_{dd}$. When the voltage of the control node (cn1) becomes $V_{dd}$, the transistor 211 is turned on, so that the voltage of the input node (in) is instantly raised by the voltage held in the storage node (fn) and then raised to $V_{sta}$ in an extremely short time. Consequently, the reference voltage generating circuit 202 can be brought into a stable equilibrium state.

Note that one embodiment of the present invention is not limited to the circuit configuration described in this embodiment. For example, a switch, a resistor, a capacitor, a transistor, a logic circuit, or the like may be added to the circuit described in this embodiment.

The startup circuit and the reference voltage generating circuit are directly connected to each other in this embodiment; however, one embodiment of the present invention is not limited to this. An additional circuit or element may be connected between the startup circuit and the reference voltage generating circuit as long as electrical connection is possible between the input node of the reference voltage generating circuit and the storage node in the startup circuit. For example, a transistor, an analog switch, a feedback operational amplifier, a bidirectional buffer circuit, or the like may be connected therebetween.

The startup circuit for the reference voltage generating circuit described in this embodiment includes the capacitor 213 and the transistor 211 with extremely low leakage current in an off state, whereby the voltage of the input node in a stable equilibrium state of the reference voltage generating circuit can be held in the storage node even when power is not supplied and voltage close to the voltage in a stable equilibrium state can be instantly output to the input node when the reference voltage generating circuit is started up. Accordingly, the startup time of the reference voltage generating circuit can be extremely short. Moreover, power supply to the reference voltage generating circuit is controlled by the control circuit in the startup circuit and the reference voltage generating circuit can be made inactive when not needed; accordingly, unnecessary power consumption can be suppressed and a reference voltage generating circuit which is driven with low power can be realized.

This embodiment can be implemented in an appropriate combination with any of the other embodiments described in this specification.

Embodiment 3

In this embodiment, an example of a configuration in which a β multiplier self-bias reference voltage generating circuit is used as a reference voltage generating circuit will be described with reference to FIG. 5.

<Configuration Example>

Figure 5:
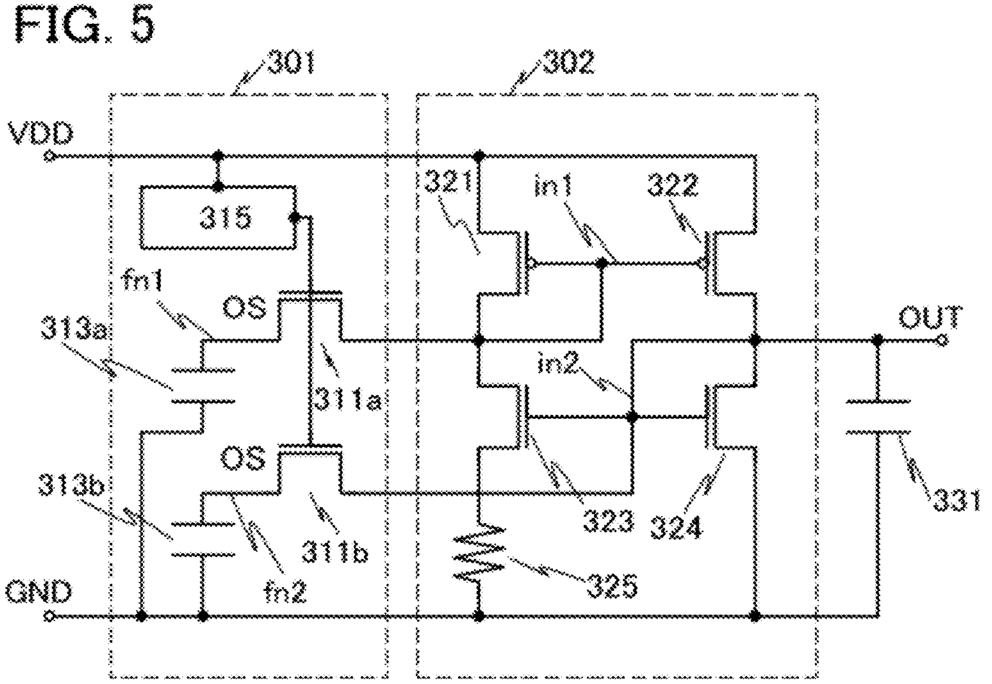
FIG. 5 illustrates a configuration of a startup circuit for a reference voltage generating circuit and the like, which is one embodiment of the present invention.

FIG. 5 is a circuit diagram of a reference voltage generating circuit to which a startup circuit of this embodiment is connected.

Figure 8:
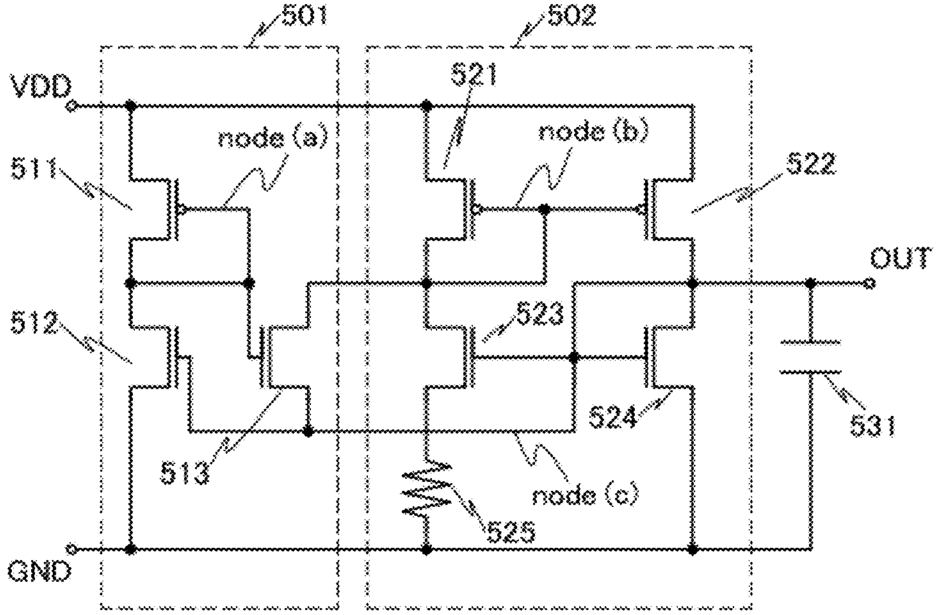

A reference voltage generating circuit 302 is a circuit similar to the reference voltage generating circuit 502 illustrated in FIG. 8. The reference voltage generating circuit 302 includes a transistor 321, a transistor 322, a transistor 323, a transistor 324, and a resistor 325. Although the reference numerals used here are different from those in FIG. 8, connection among the transistors and the resistor is similar to that in the reference voltage generating circuit 502. Here, a node connected to a gate of the transistor 321 and a gate of the transistor 322 is referred to as an input node (in1), and a node connected to a gate of the transistor 323 and a gate of the transistor 324 is referred to as an input node (in2). Note that the input node (in2) corresponds to a node connected to an output terminal OUT.

A startup circuit 301 includes a control circuit 315, two transistors (a transistor 311*a* and a transistor 311*b*), and two capacitors (a capacitor 313*a* and a capacitor 313*b*).

As each of the transistor 311*a* and the transistor 311*b*, an n-channel transistor including an oxide semiconductor in a semiconductor layer where a channel is formed can be used as in the case of the transistors used for the startup circuits described in the above embodiments. By using such a transistor, the leakage current in an off state can be made extremely low, an influence of voltage drop due to leakage current of the transistors can be reduced, and the voltages of storage nodes connected to the transistors can be held for a long time.

A gate of the transistor 311*a* and a gate of the transistor 311*b* are connected to the control circuit 315, and the on/off state thereof is controlled by the control circuit 315. A first electrode of the capacitor 313*a* is connected to a first electrode of the transistor 311*a*, and a first electrode of the capacitor 313*b* is connected to a first electrode of the transistor 311*b*. A second electrode of the capacitor 313*a* and a second electrode of the capacitor 313*b* are connected to the ground voltage input portion GND. Here, a node between the transistor 311*a* and the capacitor 313*a* is referred to as a storage node (fn1), and a node between the transistor 311*b* and the capacitor 313*b* is referred to as a storage node (fn2). Different voltages can be held in the storage nodes by turning off the transistors.

A second electrode of the transistor 311*a* is connected to the input node (in1) and a second electrode of the transistor 311*b* is connected to the input node (in2), whereby the startup circuit 301 and the reference voltage generating circuit 302 are electrically connected to each other. In this configuration, a load capacitor 331 is connected to an output portion of the reference voltage generating circuit 302 as an output load; however, any circuit that operates with the use of reference voltage may be connected to the output portion of the reference voltage generating circuit 302.

<Example of Circuit Operation>

When the reference voltage generating circuit 302 operates in a stable equilibrium state, the voltage of the input node (in1) and the voltage of the input node (in2) are voltage $V_{sta1}$ and voltage $V_{sta2}$, respectively, which are voltages of the nodes in a stable equilibrium state. At this time, the control circuit 315 outputs, for example, the power supply voltage $V_{dd}$ to the gates of the transistor 311*a* and the transistor 311*b* to turn them on.

In the case where power supply is stopped, the control circuit 315 outputs, for example, the ground voltage $V_{gnd}$ to the gates of the transistor 311*a* and the transistor 311*b* to turn them off before power supply is stopped. At this time, voltage close to the voltage $V_{sta1}$ of the input node (in1) in a stable equilibrium state is held in the storage node (fn1); similarly, voltage close to the voltage $V_{sta2}$ of the input node (in2) in a stable equilibrium state is held in the storage node (fn2).

When power supply is stopped, the reference voltage generating circuit 302 is made inactive and the transistors in the circuit are all turned off; therefore, current does not flow. The transistor 311*a* and the transistor 311*b* in the startup circuit remain in an off state; therefore, the voltage of the storage node (fn1) and the voltage of the storage node (fn2) are held without dropping.

When power is input again, the control circuit 315 outputs, for example, the power supply voltage $V_{dd}$ to the gates of the transistor 311*a* and the transistor 311*b* to turn them on. When the transistor 311*a* is turned on, current flows between the input node (in1) and the storage node (fn1), so that the voltage of the input node (in1) is instantly changed to voltage close to the voltage $V_{sta1}$ of the input node (in1) in a stable equilibrium state. In a similar manner, when the transistor 311*b* is turned on, the voltage of the input node (in2) is instantly changed to voltage close to $V_{sta2}$ by the voltage held in the storage node (fn2).

Thus, with the startup circuit 301 including the two storage nodes, when power is input, the voltages of the two nodes in the reference voltage generating circuit 302 can be instantly changed to levels close to those of the voltages in a stable equilibrium state at the same time. Accordingly, the startup time of the reference voltage generating circuit 302 can be efficiently shortened as compared to the case where a startup circuit is connected to either one of the input nodes.

<Variation>

A variation of the above startup circuit 301 will be described below with reference to FIG. 6.

Figure 6:
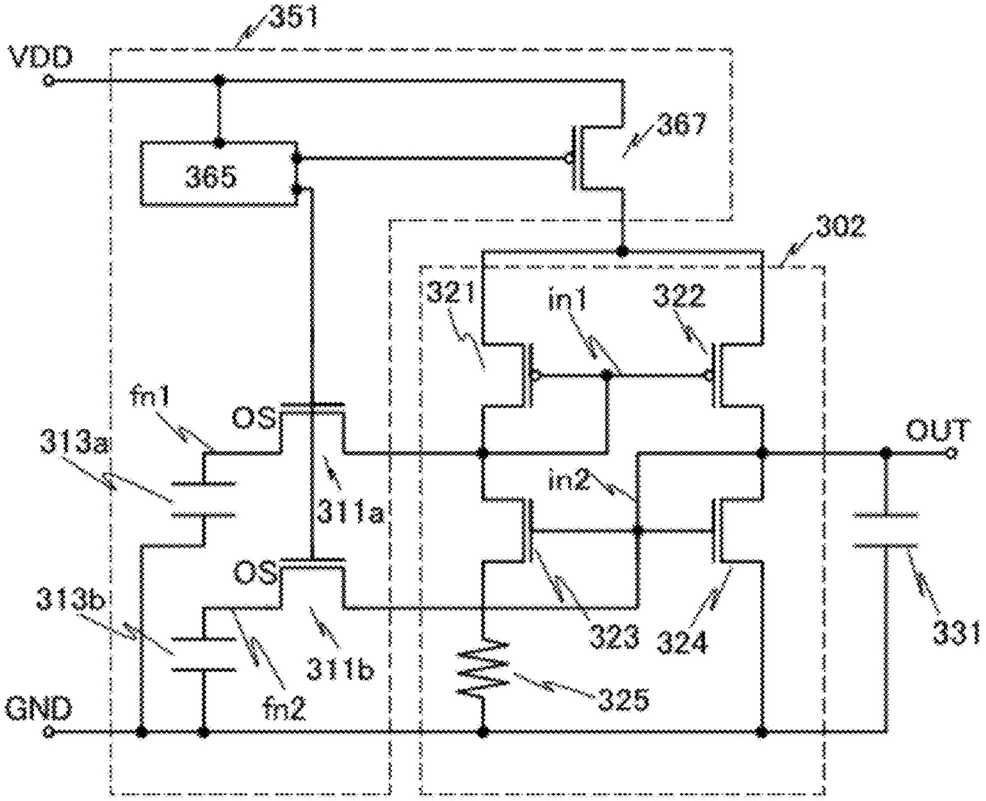
FIG. 6 illustrates a configuration of a startup circuit for a reference voltage generating circuit and the like, which is one embodiment of the present invention.

A startup circuit 351 illustrated in FIG. 6 has the same configuration as the startup circuit 301 except that a control circuit 365 is used instead of the control circuit 315 and that a transistor 367 is added.

A gate of the transistor 367 is connected to the control circuit 365, a first electrode of the transistor 367 is connected to the power input portion VDD, and a second electrode of the transistor 367 is connected to the first electrode of the transistor 321 and the first electrode of the transistor 322 in the reference voltage generating circuit 302. By using a p-channel transistor as the transistor 367, the power supply voltage $V_{dd}$ can be input to the reference voltage generating circuit 302 without an influence of voltage drop due to the transistor.

As in the case of the control circuit 315, the control circuit 365 is connected to the gates of the transistor 311*a* and the transistor 311*b* and controls the on/off state of these transistors. Further, the control circuit 365 has a function of controlling the on/off state of the transistor 367 by transmitting a control signal to the gate of the transistor 367.

With such a configuration, power supply to the reference voltage generating circuit 302 can be controlled and the operating/non-operating state of the reference voltage generating circuit 302 can be controlled. For example, when voltage which allows the transistor 367 to be turned on, such as the ground voltage $V_{gnd}$, is output to the gate of the transistor 367 in the state where power is supplied, the power supply voltage $V_{dd}$ can be input to the reference voltage generating circuit 302. When voltage which allows the transistor 367 to be turned off, such as the power supply voltage $V_{dd}$, is output to the gate of the transistor 367 in the state where power is supplied, the power supply voltage is not input to the reference voltage generating circuit 302 and thus the reference voltage generating circuit 302 can be kept from operating.

Accordingly, power supply to the reference voltage generating circuit 302 is controlled by the control circuit 365 in the startup circuit and the reference voltage generating circuit can be made inactive when not needed; accordingly, unnecessary power consumption can be suppressed and a reference voltage generating circuit which is driven with low power can be realized.

Note that a configuration in which the startup circuit includes the two storage nodes is described in this embodiment; depending on the configuration of a reference voltage generating circuit connected to the startup circuit, the startup circuit can include any number (at least one) of storage nodes. For example, in the case where the startup circuit includes three storage nodes, a configuration in which three transistors whose gates are connected one another and capacitors connected to the transistors are provided may be employed. Alternatively, the startup circuit may include one storage node which is connected to only one node in the reference voltage generating circuit. With such a configuration, the area occupied by the startup circuit can be reduced.

Note that one embodiment of the present invention is not limited to the circuit configuration described in this embodiment. For example, a switch, a resistor, a capacitor, a transistor, a logic circuit, or the like may be added to the circuit described in this embodiment.

The startup circuit and the reference voltage generating circuit are directly connected to each other in this embodiment; however, one embodiment of the present invention is not limited to this. An additional circuit or element may be connected between the startup circuit and the reference voltage generating circuit as long as electrical connection is possible between the input node of the reference voltage generating circuit and the storage node in the startup circuit. For example, a transistor, an analog switch, a feedback operational amplifier, a bidirectional buffer circuit, or the like may be connected therebetween.

The startup circuit for the reference voltage generating circuit described in this embodiment includes the capacitor and the transistor with extremely low leakage current in an off state, whereby the voltage of the input node in a stable equilibrium state of the reference voltage generating circuit can be held in the storage node even when power is not supplied and voltage close to the voltage in a stable equilibrium state can be instantly output to the input node when power is input again. Accordingly, the startup time of the reference voltage generating circuit can be extremely short.

This embodiment can be implemented in an appropriate combination with any of the other embodiments described in this specification.

Embodiment 4

In this embodiment, an example of a configuration in which a bandgap-based reference voltage generating circuit is used as a reference voltage generating circuit will be described with reference to FIG. 7.

Figure 7:
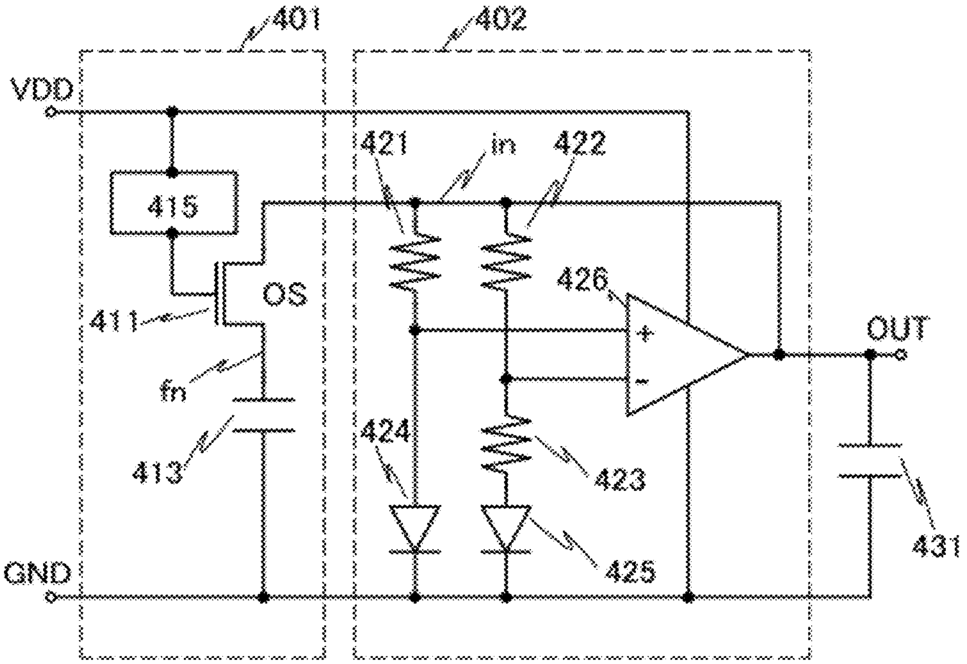
FIG. 7 illustrates a configuration of a startup circuit for a reference voltage generating circuit and the like, which is one embodiment of the present invention.

FIG. 7 is a circuit diagram illustrating a configuration of a bandgap-based reference voltage generating circuit to which a startup circuit according to one embodiment of the present invention is connected.

A startup circuit 401 includes a control circuit 415, a transistor 411, and a capacitor 413, and voltage can be held in the storage node (fn) between the transistor 411 and the capacitor 413. The transistor 411 is controlled by the control circuit 415 connected to a gate of the transistor 411.

As the transistor 411, an n-channel transistor including an oxide semiconductor in a semiconductor layer where a channel is formed can be used as in the above embodiments. By using such a transistor, the leakage current in an off state can be made extremely low, an influence of voltage drop due to leakage current of the transistor 411 can be reduced, and the voltage of the storage node (fn) connected to the transistor 411 can be held for a long time.

A reference voltage generating circuit 402 is one of bandgap-based reference voltage generating circuits and includes three resistors (a resistor 421, a resistor 422, and a resistor 423), two diodes (a diode 424 and a diode 425), and an operational amplifier 426. A first electrode of the resistor 421 is connected to a first electrode of the resistor 422 and an output terminal of the operational amplifier 426, and a second electrode of the resistor 421 is connected to a positive input terminal of the operational amplifier 426 and a first electrode of the diode 424. A second electrode of the resistor 422 is connected to a negative input terminal of the operational amplifier 426 and a first electrode of the resistor 423. A second electrode of the resistor 423 is connected to a first electrode of the diode 425. A second electrode of the diode 424 and a second electrode of the diode 425 are connected to the ground voltage input portion GND. One of two power supply terminals of the operational amplifier 426 is connected to the power input portion VDD and the other is connected to the ground voltage input portion GND. Note that a node connected to the first electrodes of the resistor 421 and the resistor 422 and the output terminal of the operational amplifier 426 is referred to as an input node (in).

When power is input, the reference voltage generating circuit 402 operates so that the difference between the voltage of a node connected to the positive input terminal of the operational amplifier 426 and the voltage of a node connected to the negative input terminal of the operational amplifier 426 becomes zero. Therefore, the output voltage of the reference voltage generating circuit 402 in a stable equilibrium state is determined by the difference between voltages input to the two power supply terminals of the operational amplifier 426, a relation among the resistances of the three resistors, and current-voltage characteristics of the two diodes.

A first electrode of the transistor 411 in the startup circuit 401 is connected to the input node (in) of the reference voltage generating circuit 402, whereby the startup circuit 401 and the reference voltage generating circuit 402 are electrically connected to each other. In this configuration, a load capacitor 431 is connected to an output portion of the reference voltage generating circuit 402 as an output load; however, any circuit that operates with the use of the output voltage of the reference voltage generating circuit 402 may be connected to the output portion of the reference voltage generating circuit 402.

In the startup circuit 401, as in the above embodiments, by controlling the transistor 411 with the control circuit 415, voltage close to the voltage of the input node (in) in the case where the reference voltage generating circuit 402 operates in a stable equilibrium state can be held in the storage node (fn) even when power is not supplied. Moreover, by turning on the transistor 411 when power is input again, the voltage of the input node (in) in the reference voltage generating circuit 402 can be instantly changed to voltage close to the voltage in a stable equilibrium state. Accordingly, the startup time of the reference voltage generating circuit 402 can be extremely short.

Note that the control circuit in the startup circuit 401 controls only the transistor 411 in this embodiment; however, the control circuit may control supply of power supply voltage to the reference voltage generating circuit 402 as shown in Embodiment 3 as a variation. For example, a p-channel transistor may be connected in series to the node of the operational amplifier 426 connected to the power input portion VDD, and the transistor may be controlled by the control circuit in the startup circuit. With such a configuration, power supply to the reference voltage generating circuit is controlled by the control circuit in the startup circuit and the reference voltage generating circuit can be made inactive when not needed; accordingly, unnecessary power consumption can be suppressed and a reference voltage generating circuit which is driven with low power can be realized.

Note that a configuration in which the startup circuit includes one storage node is described in this embodiment; depending on the configuration of a reference voltage generating circuit connected to the startup circuit, the startup circuit can include any number (at least one) of storage nodes. For example, in the case where the startup circuit includes three storage nodes, a configuration in which three transistors whose gates are connected one another and capacitors connected to the transistors are provided may be employed.

Note that one embodiment of the present invention is not limited to the circuit configuration described in this embodiment. For example, a switch, a resistor, a capacitor, a transistor, a logic circuit, or the like may be added to the circuit described in this embodiment.

The startup circuit and the reference voltage generating circuit are directly connected to each other in this embodiment; however, one embodiment of the present invention is not limited to this. An additional circuit or element may be connected between the startup circuit and the reference voltage generating circuit as long as electrical connection is possible between the input node of the reference voltage generating circuit and the storage node in the startup circuit. For example, a transistor, an analog switch, a feedback operational amplifier, a bidirectional buffer circuit, or the like may be connected therebetween.

The startup circuit for the reference voltage generating circuit described in this embodiment includes the capacitor and the transistor with extremely low leakage current in an off state, whereby the voltage of the input node in a stable equilibrium state of the reference voltage generating circuit can be held in the storage node even when power is not supplied and voltage close to the voltage in a stable equilibrium state can be instantly output to the input node when power is input again. Accordingly, the startup time of the reference voltage generating circuit can be extremely short.

This embodiment can be implemented in an appropriate combination with any of the other embodiments described in this specification.

Embodiment 5

In this embodiment, an example of a structure of a transistor including an oxide semiconductor in a semiconductor layer where a channel is formed, which is used for any of the startup circuits in Embodiments 1 to 4, and an example of a method for manufacturing the transistor will be described with reference to FIGS. 9A to 9E.

Figure 9A:
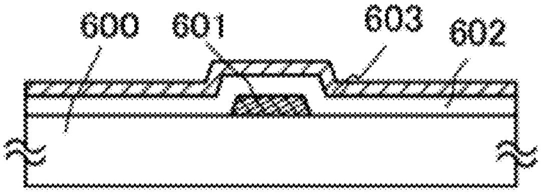
FIGS. 9A to 9E illustrate a structure and a manufacturing method of a transistor which is one embodiment of the present invention.
Figure 9B:
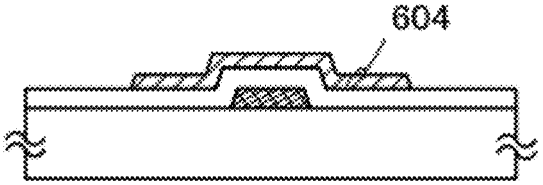
Figure 9C:
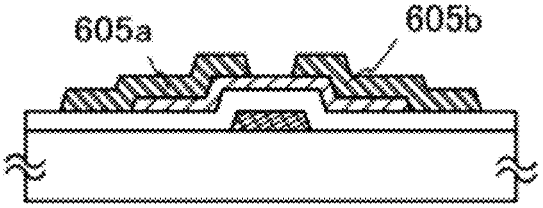
Figure 9D:
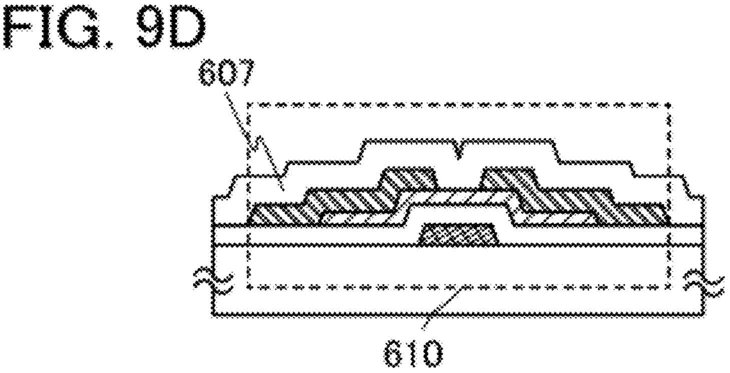
Figure 9E:
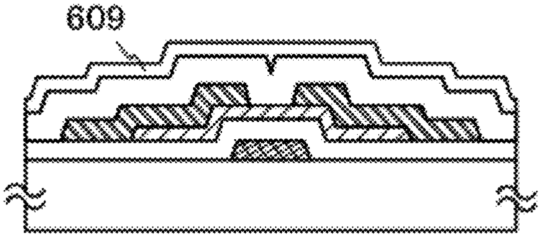

FIGS. 9A to 9E illustrate examples of cross-sectional structures of a transistor. A transistor 610 in FIG. 9D is an inverted staggered transistor having a bottom-gate structure.

An oxide semiconductor used for a semiconductor layer in this embodiment is made to be an i-type (intrinsic) oxide semiconductor or a substantially i-type (intrinsic) oxide semiconductor by being highly purified by removing hydrogen which is an n-type impurity from the oxide semiconductor so that impurities are included as few as possible.

Note that the highly purified oxide semiconductor includes extremely few carriers, and the carrier concentration is lower than $1\times10^{14}/cm^3$, lower than $1\times10^{12}/cm^3$, or lower than $1\times10^{11}/cm^3$. Such few carriers enable current in an off state (off-state current) to be sufficiently low.

Specifically, in a transistor including the oxide semiconductor layer, the density of leakage current between a source and a drain per micrometer of a channel width in an off state (off-state current density) can be 10 zA/μm ($1\times10^{-20}$ A/μm) or lower, 1 zA/μm ($1\times10^{-21}$ A/μm) or lower, or 100 yA/μm ($1\times10^{-22}$ A/μm) or lower at a source-drain voltage of 3.0 V at operating temperature (e.g., 25° C.).

In the transistor 610 including the highly purified oxide semiconductor layer, the temperature dependence of on-state current is hardly observed, and off-state current remains extremely low at high temperature.

A process for manufacturing the transistor 610 over a substrate 600 will be described below with reference to FIGS. 9A to 9E.

First, a conductive film is formed over the substrate 600 having an insulating surface. Then, a gate electrode layer 601 is formed in a first photolithography step. Note that a resist mask may be formed by an inkjet method. Formation of the resist mask by an inkjet method needs no photomask; thus, manufacturing cost can be reduced.

There is no particular limitation on the substrate 600 as long as the substrate 600 has an insulating surface; in the case where heat treatment is performed in a later step, the substrate 600 needs to have at least heat resistance enough to withstand the temperature of the heat treatment. For example, a glass substrate of barium borosilicate glass, aluminoborosilicate glass, or the like, a quartz substrate, a sapphire substrate, a ceramic substrate, or the like can be used. Alternatively, a metal substrate including stainless steel or a semiconductor substrate having an insulating film formed on its surface may be used. A flexible substrate formed using a synthetic resin such as plastics generally has a lower upper temperature limit than the above substrates; however, such a substrate can be used as long as it can withstand processing temperature in the manufacturing process. Note that a surface of the substrate 600 may be planarized by polishing using a CMP method or the like.

In this embodiment, as the substrate 600 having an insulating surface, a glass substrate is used.

An insulating layer serving as a base may be provided between the substrate 600 and the gate electrode layer 601. The insulating layer has a function of preventing diffusion of impurity elements from the substrate 600, and can be formed to have a single-layer or stacked-layer structure using one or more films selected from a silicon nitride film, a silicon oxide film, a silicon nitride oxide film, a silicon oxynitride film, and the like.

The gate electrode layer 601 can be formed to have a single-layer or stacked-layer structure using a metal such as molybdenum, titanium, chromium, tantalum, tungsten, neodymium, or scandium, or an alloy including any of these metals as a main component. Note that aluminum or copper can also be used as such a metal as long as it can withstand the temperature of heat treatment performed in a later step. Aluminum or copper is preferably combined with a refractory metal in order to prevent a heat resistance problem and a corrosive problem. As the refractory metal, molybdenum, titanium, chromium, tantalum, tungsten, neodymium, scandium, or the like can be used.

Next, a gate insulating layer 602 is formed over the gate electrode layer 601. The gate insulating layer 602 can be formed by a plasma CVD method, a sputtering method, or the like. The gate insulating layer 602 can be formed to have a single-layer or stacked-layer structure using one or more films selected from a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, a tantalum oxide film, a gallium oxide film, and the like.

For the oxide semiconductor layer in this embodiment, an oxide semiconductor which is made to be an i-type or substantially i-type oxide semiconductor (a highly purified oxide semiconductor) by removing an impurity is used. Such a highly purified oxide semiconductor is highly sensitive to an interface state and interface charge; thus, an interface between the oxide semiconductor layer and the gate insulating layer is important. For that reason, the gate insulating layer in contact with the highly purified oxide semiconductor needs to have high quality.

For example, high-density plasma CVD using microwaves (e.g., with a frequency of 2.45 GHz) is preferable because a dense high-quality insulating layer with high withstand voltage can be formed. The highly purified oxide semiconductor and the high-quality gate insulating layer are in contact with each other, whereby the number of interface states can be reduced to obtain favorable interface characteristics.

Needless to say, another film formation method such as a sputtering method or a plasma CVD method can be employed as long as the method enables formation of a high-quality insulating layer as a gate insulating layer. Further, an insulating layer whose film quality and characteristic of the interface with an oxide semiconductor are improved by heat treatment performed after formation thereof may be formed as the gate insulating layer. In any case, any gate insulating layer can be used as long as film quality as a gate insulating layer is high, interface state density with an oxide semiconductor can be reduced, and a favorable interface can be formed.

The gate insulating layer 602 is in contact with an oxide semiconductor layer formed later. When hydrogen is included in the oxide semiconductor, characteristics of the transistor are adversely affected; therefore, it is preferable that the gate insulating layer 602 do not include hydrogen, a hydroxyl group, and moisture. In order that hydrogen, a hydroxyl group, and moisture may be included in the gate insulating layer 602 and an oxide semiconductor film as little as possible, it is preferable that the substrate 600 over which the gate electrode layer 601 is formed or the substrate 600 over which components up to and including the gate insulating layer 602 are formed be preheated in a preheating chamber of a sputtering apparatus as pretreatment for formation of the oxide semiconductor film so that impurities such as hydrogen and moisture adsorbed to the substrate 600 are removed. The temperature of the preheating is higher than or equal to 100° C. and lower than or equal to 400° C., preferably higher than or equal to 150° C. and lower than or equal to 300° C. As an evacuation unit provided in the preheating chamber, a cryopump is preferable. Note that this preheating treatment can be omitted. Further, the preheating may be performed in a similar manner on the substrate 600 over which components up to and including a source electrode layer 605*a* and a drain electrode layer 605*b* are formed, before formation of an insulating layer 607.

Next, an oxide semiconductor film 603 having a thickness greater than or equal to 2 nm and less than or equal to 200 nm, preferably greater than or equal to 5 nm and less than or equal to 30 nm is formed over the gate insulating layer 602 (see FIG. 9A).

The oxide semiconductor film 603 is formed by a sputtering method using an oxide semiconductor as a target. The oxide semiconductor film 603 can be formed by a sputtering method in a rare gas (e.g., argon) atmosphere, an oxygen atmosphere, or a mixed atmosphere of a rare gas (e.g., argon) and oxygen.

Note that before the oxide semiconductor film 603 is formed by a sputtering method, powder substances (also referred to as particles or dust) attached on a surface of the gate insulating layer 602 are preferably removed by reverse sputtering in which an argon gas is introduced and plasma is generated. The reverse sputtering refers to a method in which an RF power source is used for application of voltage to a substrate in an argon atmosphere and plasma is generated in the vicinity of the substrate to modify a surface. Note that instead of an argon atmosphere, a nitrogen atmosphere, a helium atmosphere, an oxygen atmosphere, or the like may be used.

An oxide semiconductor used for the oxide semiconductor film 603 preferably includes at least indium (In) or zinc (Zn). In particular, In and Zn are preferably included. As a stabilizer for reducing variation in electric characteristics of a transistor including the oxide semiconductor, gallium (Ga) is preferably additionally included. Tin (Sn) is preferably included as a stabilizer. Hafnium (Hf) is preferably included as a stabilizer. Aluminum (Al) is preferably included as a stabilizer.

As another stabilizer, one or plural kinds of lanthanoid such as lantern (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be included.

As the oxide semiconductor, for example, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide including In, Ga, and Zn as main components and there is no particular limitation on the ratio of In, Ga, and Zn. The In—Ga—Zn-based oxide may include a metal element other than In, Ga, and Zn.

Alternatively, a material expressed by $InMO_3(ZnO)_m$ (m>0, and m is not an integer) may be used as the oxide semiconductor. Note that M represents one or more metal elements selected from Ga, Fe, Mn, and Co. Alternatively, as the oxide semiconductor, a material expressed by $In_3SnO_5(ZnO)_n$ (n>0, and n is an integer) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is close to the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is close to the above compositions may be used.

However, the composition is not limited to those described above, and a material having an appropriate composition may be used in accordance with necessary semiconductor characteristics (such as mobility, threshold voltage, and variation). In order to obtain necessary semiconductor characteristics, it is preferable that the carrier concentration, the impurity concentration, the defect density, the atomic ratio of a metal element to oxygen, the interatomic distance, the density, and the like be set to be appropriate.

For example, with the In—Sn—Zn-based oxide, a high mobility can be relatively easily obtained. However, the mobility can be increased by reducing the defect density in the bulk also in the case of using the In—Ga—Zn-based oxide.

Note that for example, the expression "the composition of an oxide including In, Ga, and Zn at the atomic ratio, In:Ga:Zn=a:b:c (a+b+c=1), is close to the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystalline. Further, the oxide semiconductor may have either an amorphous structure including a portion having crystallinity or a non-amorphous structure.

In an oxide semiconductor in an amorphous state, a flat surface can be obtained relatively easily, so that when a transistor is manufactured with the use of the oxide semiconductor, interface scattering can be reduced, and relatively high mobility can be obtained relatively easily.

Furthermore, the filling rate of the oxide target is higher than or equal to 90% and lower than or equal to 100%, preferably higher than or equal to 95% and lower than or equal to 99.9%. With the use of the metal oxide target with a high filling rate, a dense oxide semiconductor film can be formed.

It is preferable that a high-purity gas from which an impurity such as hydrogen, water, a compound having a hydroxyl group, or a hydride is removed be used as a sputtering gas used to form the oxide semiconductor film 603.

The substrate is held in a deposition chamber kept under reduced pressure, and the substrate temperature is set to be higher than or equal to 100° C. and lower than or equal to 600° C., preferably higher than or equal to 200° C. and lower than or equal to 400° C. By forming the oxide semiconductor film in a state where the substrate is heated, the concentration of an impurity included in the formed oxide semiconductor film can be reduced. In addition, damage by sputtering can be reduced. The oxide semiconductor film 603 is formed over the substrate 600 in such a manner that a sputtering gas from which hydrogen and moisture are removed is introduced into the deposition chamber while moisture remaining therein is removed, and the above target is used. In order to remove moisture remaining in the deposition chamber, an entrapment vacuum pump such as a cryopump, an ion pump, or a titanium sublimation pump is preferably used. The evacuation unit may be a turbo pump provided with a cold trap. In the deposition chamber which is evacuated with the cryopump, a hydrogen atom, a compound including a hydrogen atom, such as water ($H_2O$), (preferably, also a compound including a carbon atom), and the like are removed, whereby the concentration of an impurity in the oxide semiconductor film formed in the deposition chamber can be reduced.

The atmosphere for a sputtering method may be a rare gas (typically argon) atmosphere, an oxygen atmosphere, or a mixed atmosphere of a rare gas and oxygen.

As an example of the deposition condition, the distance between the substrate and the target is 100 mm, the pressure is 0.6 Pa, the direct-current (DC) power is 0.5 kW, and the atmosphere is an oxygen atmosphere (the proportion of the oxygen flow rate is 100%). Note that a pulsed direct-current power source is preferably used because powder substances (also referred to as particles or dust) that are generated in deposition can be reduced and the film thickness can be uniform.

Note that impurities, for example, an alkali metal such as Li or Na and an alkaline earth metal such as Ca included in the oxide semiconductor film are preferably reduced. Specifically, the concentration of such an impurity included in the oxide semiconductor film is preferably $2\times10^{16}/cm^3$ or lower, further preferably $1\times10^{15}/cm^3$ or lower. Those metal elements have low electronegativity and are easily bonded to oxygen in the oxide semiconductor film; therefore, a carrier path might be formed in the oxide semiconductor film, and the oxide semiconductor film might have lower resistance (n-type conductivity).

Next, the oxide semiconductor film 603 is processed into an island-shaped oxide semiconductor layer in a second photolithography step. A resist mask for forming the island-shaped oxide semiconductor layer may be formed by an inkjet method. Formation of the resist mask by an inkjet method needs no photomask; thus, manufacturing cost can be reduced.

In the case where a contact hole is formed in the gate insulating layer 602, a step of forming the contact hole can be performed at the same time as processing of the oxide semiconductor film 603.

Note that here, etching of the oxide semiconductor film 603 may be dry etching, wet etching, or both dry etching and wet etching. An example of an etchant which can be used for wet etching of the oxide semiconductor film 603 is a mixed solution of phosphoric acid, acetic acid, and nitric acid. In addition, ITO07N (produced by KANTO CHEMICAL CO., INC.) may be used.

As an etching gas used for dry etching, a gas including chlorine (a chlorine-based gas such as chlorine ($Cl_2$), boron trichloride ($BCl_3$), silicon tetrachloride ($SiCl_4$), or carbon tetrachloride ($CCl_4$)) is preferable. Alternatively, a gas including fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As a dry etching method, a parallel plate reactive ion etching (RIE) method or an inductively coupled plasma (ICP) etching method can be used. In order to etch the oxide semiconductor film into a desired shape, the etching conditions (such as the amount of power applied to a coil-shaped electrode, the amount of power applied to an electrode on a substrate side, or the temperature of the electrode on the substrate side) are adjusted as appropriate.

Next, the island-shaped oxide semiconductor layer is subjected to first heat treatment. The oxide semiconductor layer can be dehydrated or dehydrogenated by the first heat treatment. The temperature of the first heat treatment is higher than or equal to 250° C. and lower than or equal to 750° C., or higher than or equal to 400° C. and lower than the strain point of the substrate. For example, the heat treatment may be performed at 500° C. for approximately longer than or equal to 3 minutes and shorter than or equal to 6 minutes. When an RTA method is used for the heat treatment, dehydration or dehydrogenation can be performed in a short time; therefore, treatment can be performed even at a temperature higher than the strain point of a glass substrate.

Here, the substrate is introduced into an electric furnace that is a kind of heat treatment apparatus and heat treatment is performed on the oxide semiconductor layer at 450° C. for 1 hour in a nitrogen atmosphere, and then the substrate is cooled without exposing the oxide semiconductor layer to the air so that entry of water and hydrogen into the oxide semiconductor layer is prevented. In this manner, an oxide semiconductor layer 604 is obtained (see FIG. 9B).

Further, a heat treatment apparatus is not limited to an electric furnace, and an apparatus for heating an object to be processed by heat conduction or heat radiation from a heating element such as a resistance heating element may be used. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the first heat treatment, GRTA in which the substrate is moved into an inert gas heated to a temperature as high as 650° C. to 700° C., heated for several minutes, and then moved out of the inert gas heated to the high temperature may be performed.

Note that in the first heat treatment, it is preferable that water, hydrogen, and the like be not included in nitrogen or a rare gas such as helium, neon, or argon. The purity of nitrogen or the rare gas such as helium, neon, or argon which is introduced into a heat treatment apparatus is preferably 6N (99.9999%) or higher, further preferably 7N (99.99999%) or higher (i.e., the impurity concentration is preferably 1 ppm or lower, further preferably 0.1 ppm or lower).

After the oxide semiconductor layer is heated by the first heat treatment, a high-purity oxygen gas, a high-purity $N_2O$ gas, or ultra dry air (the moisture amount is less than or equal to 20 ppm (−55° C. by conversion into a dew point), preferably less than or equal to 1 ppm, further preferably less than or equal to 10 ppb, in the case where measurement is performed with the use of a dew point meter of a cavity ring down laser spectroscopy (CRDS) system) may be introduced into the same furnace. It is preferable that the oxygen gas and the $N_2O$ gas do not include water, hydrogen, and the like. The purity of the oxygen gas or the $N_2O$ gas which is introduced into the heat treatment apparatus is preferably 6N or higher, further preferably 7N or higher (i.e., the concentration of an impurity in the oxygen gas or the $N_2O$ gas is preferably 1 ppm or lower, further preferably 0.1 ppm or lower). Oxygen which is a main component of an oxide semiconductor and has been reduced because of the step of removing impurities through the dehydration or the dehydrogenation is supplied by the action of the oxygen gas or the $N_2O$ gas, whereby the purity of the oxide semiconductor layer is increased and the oxide semiconductor layer is made to be electrically i-type (intrinsic).

The first heat treatment for the oxide semiconductor layer can also be performed on the oxide semiconductor film 603 before being processed into the island-shaped oxide semiconductor layer. In that case, the substrate is taken out of the heating apparatus after the first heat treatment, and then a photolithography step is performed.

Note that the first heat treatment may be performed at either of the following timings without limitation to the above timing as long as it is performed after the oxide semiconductor layer is formed: after a source electrode layer and a drain electrode layer are formed over the oxide semiconductor layer; and after an insulating layer is formed over the source electrode layer and the drain electrode layer.

In the case where a contact hole is formed in the gate insulating layer 602, a step of forming the contact hole may be performed before or after the first heat treatment is performed on the oxide semiconductor film 603.

Through the above steps, the concentration of hydrogen in the island-shaped oxide semiconductor layer can be reduced and the island-shaped oxide semiconductor layer can be highly purified. Accordingly, the electric characteristics of the oxide semiconductor layer can be stable. In addition, an oxide semiconductor film which has extremely low carrier density and a wide band gap can be formed by heat treatment at a temperature lower than or equal to the glass transition temperature of the substrate 600. Therefore, the transistor can be manufactured using a large-sized substrate, so that the productivity can be increased. In addition, by using the oxide semiconductor film in which the hydrogen concentration is reduced and the purity is increased, it is possible to manufacture a transistor with high withstand voltage and extremely low off-state current. The above heat treatment can be performed at any time after the oxide semiconductor film is formed.

Note that in the case where the oxide semiconductor film is heated, depending on a material of the oxide semiconductor film or heating conditions, plate-like crystals are formed at the surface of the oxide semiconductor film in some cases. The plane-like crystal is preferably a single crystal which is c-axis-aligned perpendicularly to a surface of the oxide semiconductor film. Note that when a surface of the gate insulating layer 602 under the oxide semiconductor film is uneven, a polycrystalline plate-like crystal is formed. Therefore, the surface of the base of the oxide semiconductor film is preferably as flat as possible.

As the oxide semiconductor film, an oxide semiconductor film having a crystal region with a large thickness (a single crystal region), that is, a crystal region which is c-axis-aligned perpendicularly to a surface of the film may be formed by performing deposition twice and heat treatment twice, even when any of an oxide, a nitride, a metal, and the like is used as a material for a base component. For example, a first oxide semiconductor film with a thickness greater than or equal to 3 nm and less than or equal to 15 nm is formed and then first heat treatment is performed at a temperature higher than or equal to 450° C. and lower than or equal to 850° C., preferably higher than or equal to 550° C. and lower than or equal to 750° C. in an atmosphere of nitrogen, oxygen, a rare gas, or dry air, whereby a first oxide semiconductor film which includes a crystal region (including plate-like crystals) in a region including the surface is formed. Then, a second oxide semiconductor film which has a larger thickness than the first oxide semiconductor film is formed, and second heat treatment is performed at a temperature higher than or equal to 450° C. and lower than or equal to 850° C., preferably higher than or equal to 600° C. and lower than or equal to 700° C., so that crystal growth proceeds upward with the use of the first oxide semiconductor film as a seed of the crystal growth and the whole second oxide semiconductor film is crystallized. In such a manner, the oxide semiconductor film having a crystal region with a large thickness may be formed.

Next, a conductive film to be a source electrode layer and a drain electrode layer (including a wiring formed in the same layer as the source electrode layer and the drain electrode layer) is formed over the gate insulating layer 602 and the oxide semiconductor layer 604. As the conductive film used for the source electrode layer and the drain electrode layer, for example, a metal film including an element selected from Al, Cr, Cu, Ta, Ti, Mo, and W, an alloy film including any of these elements as a component, a metal nitride film including any of these elements as a component (a titanium nitride film, a molybdenum nitride film, or a tungsten nitride film), or the like can be used. In addition, in order to prevent a heat resistance problem and a corrosive problem, a structure in which a film of a metal such as Al or Cu has, on one or both of the bottom side and the top side, a film of a refractory metal such as Ti, Mo, W, Cr, Ta, Nd, Sc, or Y, or a metal nitride film thereof (a titanium nitride film, a molybdenum nitride film, or a tungsten nitride film) may be used.

Further, the conductive film may have a single-layer structure or a stacked-layer structure including two or more layers. For example, a single-layer structure of an aluminum film including silicon; a two-layer structure in which a titanium film is stacked over an aluminum film; a three-layer structure in which a titanium film, an aluminum film, and a titanium film are stacked in this order; and the like can be given.

Alternatively, the conductive film may be formed using a conductive metal oxide. As the conductive metal oxide, indium oxide, tin oxide, zinc oxide, a mixed oxide of indium oxide and tin oxide, a mixed oxide of indium oxide and zinc oxide, or any of the conductive metal oxide materials including silicon or silicon oxide can be used.

Note that in the case where heat treatment is performed after the conductive film is formed, the conductive film preferably has heat resistance enough to withstand the heat treatment.

Next, in a third photolithography step, a resist mask is formed over the conductive film, and selective etching is performed to form the source electrode layer 605*a* and the drain electrode layer 605*b*, and then the resist mask is removed (see FIG. 9C).

Light exposure at the time of the formation of the resist mask in the third photolithography step may be performed using ultraviolet light, KrF laser light, or ArF laser light. A channel length L of the transistor completed later is determined by the distance between lower edge portions of the source electrode layer and the drain electrode layer, which are adjacent to each other over the oxide semiconductor layer 604. In the case where the channel length L is less than 25 nm, light exposure for formation of the resist mask in the third photolithography step is preferably performed using extreme ultraviolet light having an extremely short wavelength of several nanometers to several tens of nanometers. In the light exposure by extreme ultraviolet light, the resolution is high and the focus depth is large. Therefore, the channel length L of the transistor completed later can be greater than or equal to 10 nm and less than or equal to 1000 nm, whereby operation speed of a circuit can be increased.

Note that it is preferable that etching conditions be optimized so as not to etch and divide the oxide semiconductor layer 604 when the conductive film is etched. However, it is difficult to obtain conditions where only the conductive film is etched and the oxide semiconductor layer 604 is not etched at all. In some cases, part of the oxide semiconductor layer 604 is etched to be an oxide semiconductor layer having a groove portion (a recessed portion) when the conductive film is etched.

In this embodiment, a Ti film is used as the conductive film and an In—Ga—Zn—O-based oxide semiconductor is used for the oxide semiconductor layer 604; thus, ammonia hydrogen peroxide mixture (a mixed solution of ammonia, water, and hydrogen peroxide) is used as an etchant. When the ammonia hydrogen peroxide mixture is used as an etchant, the conductive film can be selectively etched.

Next, by plasma treatment using a gas such as $N_2O$, $N_2$, or Ar, water or the like adsorbed to a surface of an exposed portion of the oxide semiconductor layer may be removed. Plasma treatment may be performed using a mixture gas of oxygen and argon as well. In the case where the plasma treatment is performed, the insulating layer 607 serving as a protective insulating film in contact with part of the oxide semiconductor layer 604 is sequentially formed without exposure of the substrate to the air.

The insulating layer 607 preferably includes impurities such as moisture, and hydrogen as few as possible, and may be formed using an insulating film of a single layer or a plurality of insulating films stacked. In addition, the insulating layer 607 can be formed to a thickness of at least 1 nm by a method with which impurities such as water and hydrogen do not enter the insulating layer 607, such as a sputtering method as appropriate. When hydrogen is included in the insulating layer 607, entry of the hydrogen into the oxide semiconductor layer or extraction of oxygen in the oxide semiconductor layer by the hydrogen is caused, whereby a backchannel of the oxide semiconductor layer might have lower resistance (n-type conductivity) and thus a parasitic channel might be formed. Therefore, it is important that a formation method in which hydrogen is not used is employed so that the insulating layer 607 includes as little hydrogen as possible.

For example, an insulating film having a structure in which an aluminum oxide film with a thickness of 100 nm formed by a sputtering method is stacked over a gallium oxide film with a thickness of 200 nm formed by a sputtering method may be formed. The substrate temperature in film formation may be higher than or equal to room temperature and lower than or equal to 300° C. Further, the insulating film preferably includes much oxygen that exceeds the stoichiometric proportion, further preferably includes oxygen more than 1 time and less than two times the stoichiometric proportion. The insulating film includes excess oxygen in such a manner, so that oxygen is supplied to the interface with the island-shaped oxide semiconductor layer; thus, oxygen deficiency can be reduced.

In this embodiment, as the insulating layer 607, a silicon oxide film is formed to a thickness of 200 nm by a sputtering method. The substrate temperature in film formation may be higher than or equal to room temperature and lower than or equal to 300° C. and in this embodiment, is 100° C. The silicon oxide film can be formed by a sputtering method in a rare gas (typically argon) atmosphere, an oxygen atmosphere, or a mixed atmosphere of a rare gas and oxygen. As a target, a silicon oxide target or a silicon target can be used. For example, the silicon oxide film can be formed with the use of a silicon target by a sputtering method in an atmosphere including oxygen. As a film in insulating layer 607 which is formed in contact with the oxide semiconductor layer, an inorganic insulating film which does not include impurities such as moisture, a hydrogen ion, and an $OH^-$ group and blocks entry of these from the outside is preferably used.

Typically, a silicon oxide film, a silicon oxynitride film, an aluminum oxide film, an aluminum oxynitride film, or the like is used.

The insulating layer 607 preferably has a stacked-layer structure using a material having a high barrier property. For example, a silicon nitride film, a silicon nitride oxide film, an aluminum nitride film, an aluminum nitride oxide film, an aluminum oxide film, a gallium oxide film, or the like can be used as an insulating film having a high barrier property. By using the insulating film having a high barrier property, an impurity such as moisture or hydrogen can be prevented from entering the island-shaped oxide semiconductor layer, the gate insulating layer, or the interface between the island-shaped oxide semiconductor layer and another insulating layer and the vicinity thereof.

As in the case of formation of the oxide semiconductor film 603, an entrapment vacuum pump (such as a cryopump) is preferably used in order to remove moisture remaining in a deposition chamber of the insulating layer 607. When the insulating layer 607 is formed in the deposition chamber which is evacuated with the use of a cryopump, the concentration of an impurity included in the insulating layer 607 can be reduced. As an evacuation unit for removing moisture remaining in the deposition chamber of the insulating layer 607, a turbo pump provided with a cold trap may be used.

As a sputtering gas used in formation of the insulating layer 607, a high-purity gas from which an impurity such as hydrogen, water, a compound having a hydroxyl group, or a hydride is removed is preferably used.

Note that second heat treatment may be performed after the insulating layer 607 is formed. The heat treatment is performed in an atmosphere of nitrogen, ultra dry air, or a rare gas (such as argon or helium) preferably at a temperature higher than or equal to 200° C. and lower than or equal to 400° C., for example, higher than or equal to 250° C. and lower than or equal to 350° C. The content of water in the gas is preferably 20 ppm or lower, further preferably 1 ppm or lower, and still further preferably 10 ppb or lower. For example, the heat treatment is performed at 250° C. for 1 hour in a nitrogen atmosphere. Alternatively, RTA treatment may be performed at high temperature for a short time as in the first heat treatment. Even when oxygen deficiency is caused in the island-shaped oxide semiconductor layer by the first heat treatment, by performing heat treatment after the insulating layer 607 including oxygen is provided, oxygen is supplied to the island-shaped oxide semiconductor layer from the insulating layer 607. By supplying oxygen to the island-shaped oxide semiconductor layer, oxygen deficiency that serves as a donor is reduced in the island-shaped oxide semiconductor layer and the stoichiometric proportion can be satisfied. As a result, the island-shaped oxide semiconductor layer can be made to be substantially i-type and variation in electric characteristics of the transistor due to oxygen deficiency can be reduced, which result in improvement of the electric characteristics. The timing of the second heat treatment is not particularly limited as long as it is performed after the formation of the insulating layer 607, and the second heat treatment can be replaced with another step such as heat treatment in formation of a resin film or heat treatment for reduction of the resistance of a light-transmitting conductive film, by which the island-shaped oxide semiconductor layer can be made to be substantially i-type without increase in the steps.

Moreover, the oxygen deficiency that serves as a donor in the island-shaped oxide semiconductor layer may be reduced by subjecting the island-shaped oxide semiconductor layer to heat treatment in an oxygen atmosphere so that oxygen is added to the oxide semiconductor. The temperature of the heat treatment is, for example, higher than or equal to 100° C. and lower than 350° C., preferably higher than or equal to 150° C. and lower than 250° C. It is preferable that an oxygen gas used for the heat treatment in an oxygen atmosphere do not include water, hydrogen, and the like. The purity of the oxygen gas which is introduced into a heat treatment apparatus is preferably 6N (99.9999%) higher, further preferably 7N (99.99999%) or higher (i.e., the concentration of an impurity in the oxygen is preferably 1 ppm or lower, further preferably 0.1 ppm or lower).

In this embodiment, the second heat treatment (preferably at a temperature higher than or equal to 200° C. and lower than or equal to 400° C., for example, higher than or equal to 250° C. and lower than or equal to 350° C.) is performed in an inert gas atmosphere or an oxygen gas atmosphere. For example, the second heat treatment is performed at 250° C. for 1 hour in a nitrogen atmosphere. In the second heat treatment, part of the oxide semiconductor layer (a channel formation region) is heated while being in contact with the insulating layer 607.

Through the above steps, the first heat treatment is performed on the oxide semiconductor film so that an impurity such as hydrogen, moisture, a hydroxyl group, or a hydride (also referred to as a hydrogen compound) is intentionally removed from the oxide semiconductor layer, and oxygen which is one of main components of an oxide semiconductor and is reduced in the step of removing impurities can be supplied by the second heat treatment. Thus, the oxide semiconductor layer is highly purified to be an electrically i-type (intrinsic) oxide semiconductor.

When a silicon oxide layer having a number of defects is used as the insulating layer 607, impurities such as hydrogen, moisture, a hydroxyl group, or a hydride included in the oxide semiconductor layer are diffused to the silicon oxide layer by heat treatment performed after the formation of the silicon oxide layer, so that the impurities in the oxide semiconductor layer can be further reduced.

In the case where a silicon oxide layer including excess oxygen is used as the insulating layer 607, heat treatment performed after the formation of the insulating layer 607 has an effect of moving oxygen in the insulating layer 607 to the oxide semiconductor layer 604, so that the oxygen concentration of the oxide semiconductor layer 604 is improved and the oxide semiconductor layer 604 is highly purified.

Through the above steps, the transistor 610 is formed (see FIG. 9D).

The transistor 610 has a bottom gate structure and includes the gate electrode layer 601, the gate insulating layer 602 over the gate electrode layer 601, the island-shaped oxide semiconductor layer 604 which is over the gate insulating layer 602 and overlaps with the gate electrode layer 601, and the source electrode layer 605*a* and the drain electrode layer 605*b* which are a pair of electrode layers formed over the island-shaped oxide semiconductor layer 604.

Note that a back gate electrode may be formed in a position overlapping with the island-shaped oxide semiconductor layer by forming a conductive film over the insulating layer 607 and then patterning the conductive film. In the case where the back gate electrode is formed, an insulating layer is preferably formed so as to cover the back gate electrode. The back gate electrode can be formed using a material and a structure similar to those of the gate electrode or any of the conductive layers.

The thickness of the back gate electrode is set to be 10 nm to 400 nm, preferably 100 nm to 200 nm. For example, the back gate electrode may be formed in a such a manner that a conductive film in which a titanium film, an aluminum film, and a titanium film are stacked is formed, a resist mask is then formed by a photolithography method or the like, and an unnecessary portion is removed by etching so that the conductive film is processed (patterned) into a desired shape. The back gate electrode also functions as a light-blocking film, whereby photodegradation of the transistor such as negative-bias temperature stress photodegradation can be reduced and the reliability can be improved.

A protective insulating layer 609 may be additionally formed over the insulating layer 607. As the protective insulating layer 609, for example, a silicon nitride film is formed by an RF sputtering method. Since an RF sputtering method has high productivity, it is preferably used as a formation method of the protective insulating layer. As the protective insulating layer, an inorganic insulating film which does not include an impurity such as moisture and blocks the entry of the impurity from the outside is used; for example, a silicon nitride film, an aluminum nitride film, or the like is used. In this embodiment, the protective insulating layer 609 is formed using a silicon nitride film (see FIG. 9E).

In this embodiment, as the protective insulating layer 609, a silicon nitride film is formed by heating the substrate 600 over which components up to and including the insulating layer 607 are formed to a temperature of 100° C. to 400° C., introducing a sputtering gas including high-purity nitrogen from which hydrogen and moisture are removed, and using a target of a silicon semiconductor. Also in this case, it is preferable that moisture remaining in a treatment chamber be removed in the formation of the protective insulating layer 609 as in the case of the insulating layer 607.

After the formation of the protective insulating layer, heat treatment may be further performed at a temperature higher than or equal to 100° C. and lower than or equal to 200° C. for longer than or equal to 1 hour and shorter than or equal to 30 hours in the air. This heat treatment may be performed at a fixed heating temperature. Alternatively, the following change in the heating temperature may be conducted plural times repeatedly: the heating temperature is increased from room temperature to a temperature higher than or equal to 100° C. and lower than or equal to 200° C. and then decreased to room temperature.

The transistor described in this embodiment is characterized by extremely low leakage current in an off state. By applying such a transistor to a startup circuit for a reference voltage generating circuit like the ones described in the above embodiments, voltage held in a storage node can be prevented from being affected by voltage drop due to leakage current of the transistor and the voltage can be held for a long time.

This embodiment can be implemented in an appropriate combination with any of the other embodiments described in this specification.

Embodiment 6

A transistor including an oxide semiconductor in a semiconductor layer can have a variety of modes. In this embodiment, examples of transistors having structures different from the structure of the transistor 610 in Embodiment 5 will be described with reference to FIGS. 10A to 10D. Note that the same portions as or portions having functions similar to those in the above embodiment can be formed as in the above embodiment, and the same steps as or steps similar to those in the above embodiment can be performed as in the above embodiment; therefore, the description is not repeated in this embodiment. In addition, detailed description of the same portions is omitted.

Figure 10A:
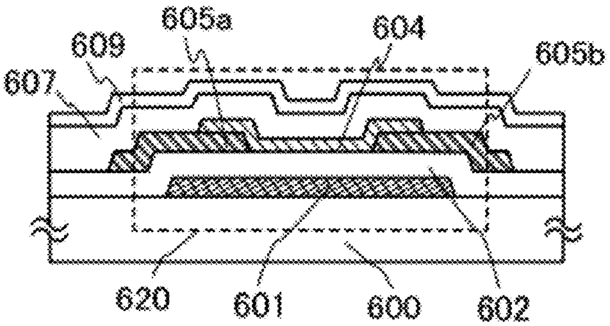
FIGS. 10A to 10D illustrate structures of transistors which are embodiments of the present invention.

A transistor 620 illustrated in FIG. 10A is an example of a bottom-gate transistor in which a gate is formed below (on a substrate side in relation to) a semiconductor layer.

The transistor 620 has a bottom-gate structure and includes the gate electrode layer 601, the gate insulating layer 602 over the gate electrode layer 601, the source electrode layer 605*a* and the drain electrode layer 605*b* which are a pair of electrode layers formed over the gate insulating layer 602, and the island-shaped oxide semiconductor layer 604 which is in contact with the source electrode layer 605*a*, the drain electrode layer 605*b*, and the gate insulating layer 602 and overlaps with the gate electrode layer 601.

Figure 10B:
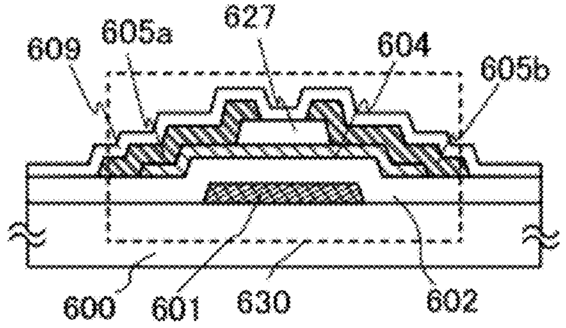

A transistor 630 illustrated in FIG. 10B has an example of a bottom-gate structure in which a channel protective layer is provided on a backchannel side in relation to an oxide semiconductor layer (a side opposite to a gate electrode). With the channel protective layer, damage to the oxide semiconductor layer at the time of etching a source electrode and a drain electrode can be suppressed.

The transistor 630 has a channel protective bottom-gate structure and includes the gate electrode layer 601, the gate insulating layer 602 over the gate electrode layer 601, the island-shaped oxide semiconductor layer 604 which is over the gate insulating layer 602 and overlaps with the gate electrode layer 601, a channel protective layer 627 which is in contact with the oxide semiconductor layer 604 and overlaps with a region of the oxide semiconductor layer 604 where a channel is formed, and the source electrode layer 605*a* and the drain electrode layer 605*b* which are a pair of electrode layers formed over the oxide semiconductor layer 604.

Figure 10C:
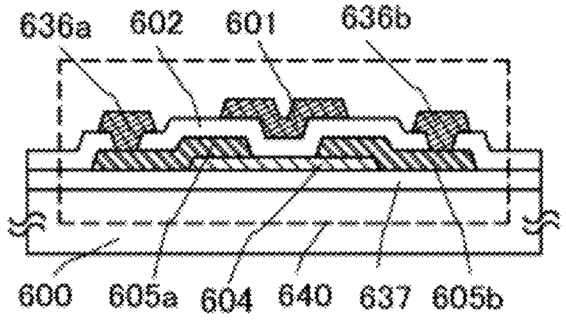

A transistor 640 illustrated in FIG. 10C is an example of a top-gate transistor.

The transistor 640 is a top-gate transistor including a base insulating layer 637, the island-shaped oxide semiconductor layer 604 over the base insulating layer 637, the source electrode layer 605*a* and the drain electrode layer 605*b* which are a pair of electrode layers in contact with the oxide semiconductor layer 604, the gate insulating layer 602 which is in contact with a channel formation region in the oxide semiconductor layer 604 between the source electrode layer 605*a* and the drain electrode layer 605*b*, and the gate electrode layer 601 which is over the gate insulating layer 602 and overlaps with the channel formation region in the oxide semiconductor layer 604.

Note that the transistor 640 may include a source wiring layer 636*a* and a drain wiring layer 636*b* which are connected to the source electrode layer 605*a* and the drain electrode layer 605*b*, respectively, through contact holes formed in the gate insulating layer 602.

Figure 10D:
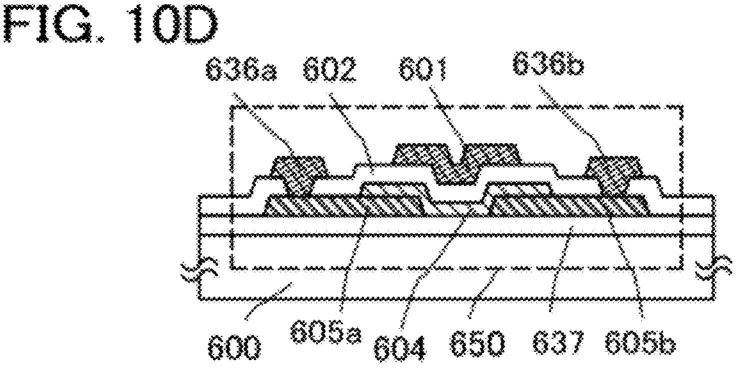

A transistor 650 illustrated in FIG. 10D is an example of a top-gate transistor having a structure different from that of the transistor 640.

The transistor 650 is a top-gate transistor including the base insulating layer 637; the source electrode layer 605*a* and the drain electrode layer 605*b* which are a pair of electrode layers over the base insulating layer 637; the oxide semiconductor layer 604 which fills a gap between the source electrode layer 605*a* and the drain electrode layer 605*b*; the gate insulating layer 602 over the source electrode layer 605*a*, the drain electrode layer 605*b*, and the oxide semiconductor layer 604; and the gate electrode layer 601 which is over the gate insulating layer 602 and overlaps with a region of the oxide semiconductor layer 604 where a channel is formed.

Note that as in the above case, the transistor 650 may include the source wiring layer 636*a* and the drain wiring layer 636*b* which are connected to the source electrode layer 605*a* and the drain electrode layer 605*b*, respectively, through contact holes formed in the gate insulating layer 602.

Although not illustrated, in the transistor 640 or the transistor 650 having a top-gate structure, a second gate electrode layer (also referred to as a back gate electrode layer) may be formed between the substrate and the base insulating layer so as to overlap with the channel formation region in the oxide semiconductor layer 604. In this case, one of the two gate electrode layers may be referred to as a first gate electrode layer and the other may be referred to as a back gate electrode. The first gate electrode layer and the back gate electrode layer can be electrically connected to each other so as to function as one electrode.

By changing the voltage of the back gate electrode layer, the threshold voltage of the transistor can be changed. The back gate electrode layer may be electrically insulated, i.e., in a floating state, receive voltage, or receive fixed voltage such as ground voltage or common voltage. By controlling the level of voltage applied to the back gate electrode layer, the threshold voltage of the transistor can be controlled.

In a top-gate structure, when the oxide semiconductor layer 604 is covered with the back gate electrode layer, light from the back gate electrode layer side can be prevented from entering the oxide semiconductor layer 604. Therefore, photodegradation of the oxide semiconductor layer 604 can be prevented and deterioration in characteristics of the transistor, such as a shift of the threshold voltage, can be prevented.

Each of the above transistors can have extremely low off-state current. By applying such a transistor to a startup circuit for a reference voltage generating circuit, like the startup circuits described in the above embodiments, voltage held in a storage node can be prevented from being affected by voltage drop due to leakage current of the transistor and the voltage can be held for a long time.

This embodiment can be implemented in an appropriate combination with any of the other embodiments described in this specification.

Embodiment 7

In this embodiment, an example of calculation of the off-state current of a transistor will be described.

Figure 13:
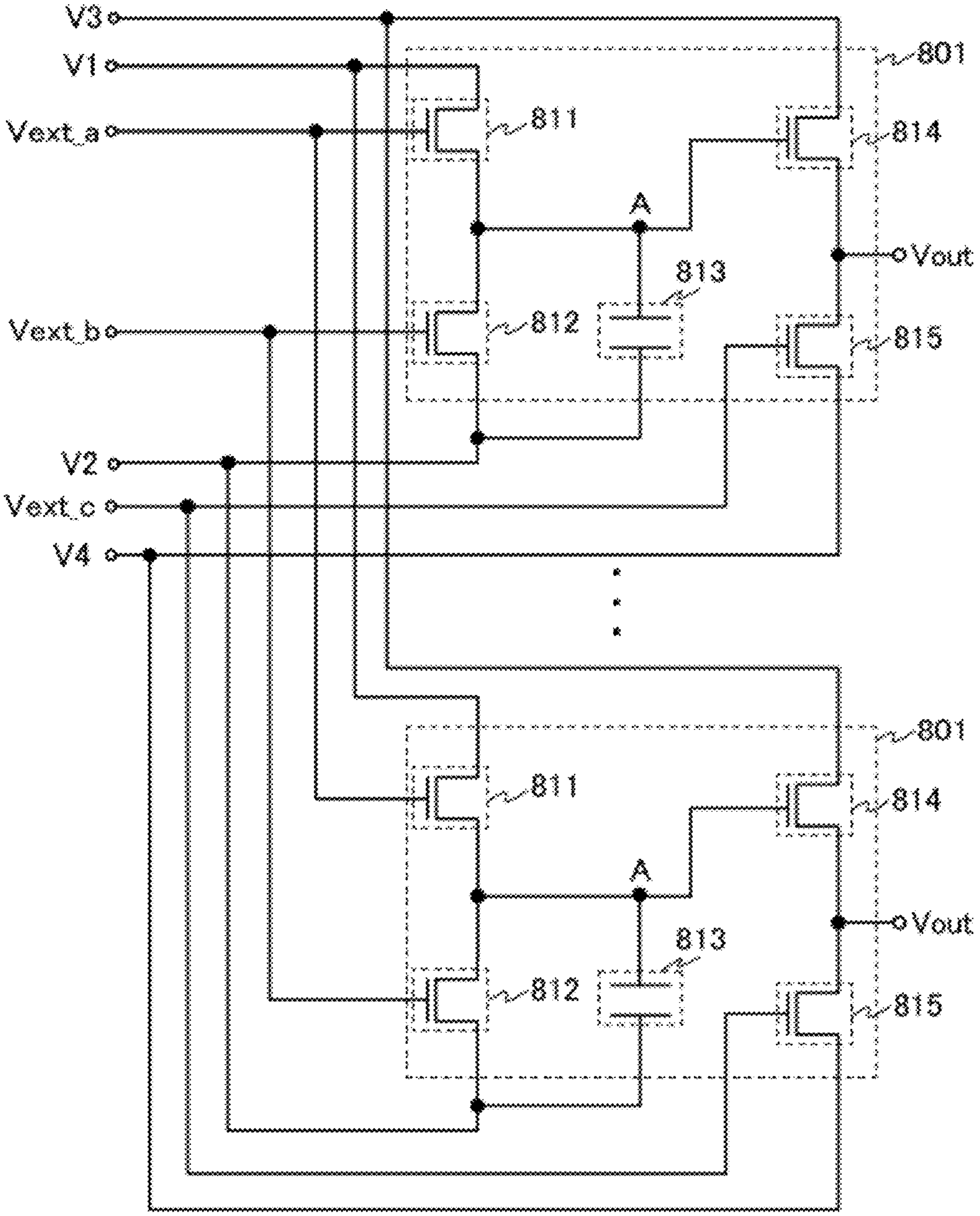
FIG. 13 is a diagram of a circuit for characteristic evaluation.

First, a configuration of a circuit for characteristic evaluation used for calculation of off-state current will be described with reference to FIG. 13. In this embodiment, the circuit for characteristic evaluation includes a plurality of measurement systems 801 which are connected in parallel to each other. Specifically, FIG. 13 illustrates an example of a circuit for characteristic evaluation in which eight measurement systems 801 are connected in parallel.

The measurement system 801 includes a transistor 811, a transistor 812, a capacitor 813, a transistor 814, and a transistor 815.

The transistor 811 is a transistor for injection of electric charge. A first terminal of the transistor 811 is connected to a node to which a potential V1 is supplied, and a second terminal of the transistor 811 is connected to a first terminal of the transistor 812. A gate electrode of the transistor 811 is connected to a node to which a potential Vext_a is supplied.

The transistor 812 is a transistor for evaluation of leakage current. Note that the leakage current in this embodiment means leakage current including off-state current of a transistor. The first terminal of the transistor 812 is connected to the second terminal of the transistor 811, and a second terminal of the transistor 812 is connected to a node to which a potential V2 is supplied. A gate electrode of the transistor 812 is connected to a node to which a potential Vext_b is supplied.

A first electrode of the capacitor 813 is connected to the second terminal of the transistor 811 and the first terminal of the transistor 812. A second electrode of the capacitor 813 is connected to the node to which the potential V2 is supplied.

A first terminal of the transistor 814 is connected to a node to which a potential V3 is supplied, and a second terminal of the transistor 814 is connected to a first terminal of the transistor 815. A gate electrode of the transistor 814 is connected to the second terminal of the transistor 811, the first terminal of the transistor 812, and the first electrode of the capacitor 813. Note that a portion to which the gate electrode of the transistor 814 is connected is referred to as a node A.

The first terminal of the transistor 815 is connected to the second terminal of the transistor 814, and a second terminal of the transistor 815 is connected to a node to which a potential V4 is supplied. A gate electrode of the transistor 815 is connected to a node to which a potential Vext_c is supplied.

The measurement system 801 outputs a potential of a node to which the second terminal of the transistor 814 and the first terminal of the transistor 815 are connected as a potential Vout of an output signal.

In this embodiment, a transistor which includes an oxide semiconductor in an active layer and includes a channel formation region included in the active layer and having a channel length L of 10 μm and a channel width W of 10 μm was used as the transistor 811.

Note that a channel formation region corresponds to a region of a semiconductor film, which exists between a source electrode and a drain electrode and overlaps with a gate electrode with a gate insulating film positioned therebetween.

As each of the transistor 814 and the transistor 815, a transistor which includes an oxide semiconductor in an active layer and includes a channel formation region included in the active layer and having a channel length L of 3 μm and a channel width W of 100 μm was used.

As the transistor 812, a bottom-gate transistor which includes an oxide semiconductor in an active layer was used. In the transistor, a source electrode and a drain electrode are in contact with an upper portion of the active layer, a region where the source electrode and the drain electrode overlap with a gate electrode is not provided, and an offset region with a width of 1 μm is provided. Provision of the offset region can reduce parasitic capacitance. As the transistor 812, transistors whose channel formation regions included in active layers have various sizes as noted in Conditions 1 to 6 in Table 1 below were used.

TABLE 1

| | Channel Length L [μm] | Channel Width W [μm] |
|---|---|---|
| Condition 1 | 1.5 | $1 \times 10^5$ |
| Condition 2 | 3 | $1 \times 10^5$ |
| Condition 3 | 10 | $1 \times 10^5$ |
| Condition 4 | 1.5 | $1 \times 10^6$ |
| Condition 5 | 3 | $1 \times 10^6$ |
| Condition 6 | 10 | $1 \times 10^6$ |

In the case of not providing the transistor 811 for injection of electric charge in the measurement system 801, the transistor 812 for evaluation of leakage current needs to be turned on at the time of injecting electric charge to the capacitor 813. In this case, if the transistor 812 for evaluation of leakage current is an element that requires a long time to turn into a steady off-state from an on-state, the measurement would take a long time. As illustrated in FIG. 13, the transistor 811 for injection of electric charge and the transistor 812 for evaluation of leakage current are separately provided in the measurement system 801, whereby the transistor 812 for evaluation of leakage current can be always kept in an off state at the time of injection of electric charge. Thus, the time required for measurement can be shortened.

In addition, by separately providing the transistor 811 for injection of electric charge and the transistor 812 for evaluation of leakage current in the measurement system 801, each of these transistors can have a proper size. Further, by making the channel width W of the transistor 812 for evaluation of leakage current larger than that of the transistor 811 for injection of electric charge, the leakage current inside the circuit for characteristic evaluation except for the leakage current of the transistor 812 for evaluation of leakage current can be made relatively low. As a result, the leakage current of the transistor 812 for evaluation of leakage current can be measured with high accuracy. Further, since the transistor 812 for evaluation of leakage current does not need to be turned on at the time of injection of electric charge, an influence of fluctuation in the potential of the node A caused by part of electric charge in the channel formation region flowing into the node A can be prevented.

On the other hand, by making the channel width W of the transistor 811 for injection of electric charge smaller than that of the transistor 812 for evaluation of leakage current, the leakage current of the transistor 811 for injection of electric charge can be made relatively low. Further, fluctuation in the potential of the node A caused by part of electric charge in the channel formation region flowing into the node A has little influence at the time of injection of electric charge.

In addition, by connecting the plurality of measurement systems 801 in parallel as illustrated in FIG. 13, the leakage current of the circuit for characteristic evaluation can be calculated with higher accuracy.

Next, a specific method for calculating the off-state current of a transistor with the use of the circuit for characteristic evaluation illustrated in FIG. 13 will be described.

Figure 14:
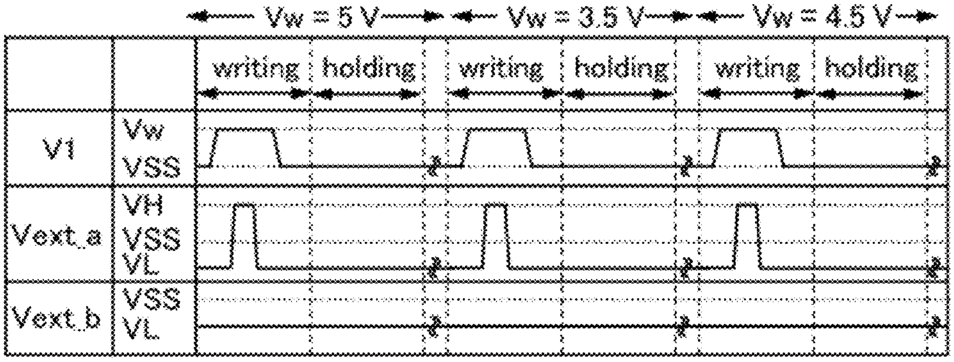
FIG. 14 is a timing chart of a circuit for characteristic evaluation.

First, a method for measuring the leakage current of the circuit for characteristic evaluation illustrated in FIG. 13 will be described with referent to FIG. 14. FIG. 14 is a timing chart for showing a method for measuring the leakage current with the use of the circuit for characteristic evaluation illustrated in FIG. 13.

In the method for measuring the leakage current with the use of the circuit for characteristic evaluation illustrated in FIG. 13, a writing period and a holding period are provided. Operation in each period will be described below. Note that in both the writing period and the holding period, the potential V2 and the potential V4 are each set to 0 V, the potential V3 is set to 5 V, and the potential Vext_c is set to 0.5 V.

First, in the writing period, the potential Vext_b is set to a potential VL (−3 V) with which the transistor 812 is turned off. The potential V1 is set to a writing potential Vw, and then the potential Vext_a is set to a potential VH (5 V) with which the transistor 811 is in an on state for a certain period. In the above manner, electric charge is accumulated in the node A, and the potential of the node A becomes equivalent to the writing potential Vw. Then, the potential Vext_a is set to the potential VL with which the transistor 811 is turned off. Then, the potential V1 is set to a potential VSS (0 V).

Next, in the holding period, the amount of change in the potential of the node A, caused by change in the amount of electric charge held in the node A, is measured. From the amount of change in the potential, the value of the current flowing between the source electrode and the drain electrode of the transistor 812 can be calculated. In such a manner, accumulation of electric charge in the node A and measurement of the amount of change in the potential of the node A can be performed.

Accumulation of electric charge in the node A and measurement of the amount of change in the potential of the node A (also referred to as accumulation and measurement operation) are repeatedly performed. Firstly, first accumulation and measurement operation is repeated 15 times. In the first accumulation and measurement operation, a potential of 5 V is input as the writing potential Vw in the writing period, and held for 1 hour in the holding period. Next, second accumulation and measurement operation is repeated twice. In the second accumulation and measurement operation, a potential of 3.5 V is input as the writing potential Vw in the writing period, and held for 50 hours in the holding period. Then, third accumulation and measurement operation is performed once. In the third accumulation and measurement operation, a potential of 4.5 V is input as the writing potential Vw in the writing period, and held for 10 hours in the holding period. By repeating the accumulation and measurement operation, the measured current value can be confirmed to be the value in the steady state. In other words, it is possible to remove a transient (current decreasing with time after the start of the measurement) from current $I_A$ flowing through the node A. As a result, the leakage current can be measured with higher accuracy.

In general, the potential $V_A$ of the node A can be expressed as a function of the potential Vout of the output signal by the following equation.

$$V_A=F(V\text{out}) \quad \text{[Formula 1]}$$

Electric charge $Q_A$ of the node A can be expressed by the following equation with the use of the potential $V_A$ of the node A, capacitance $C_A$ connected to the node A, and a constant (const). The capacitance $C_A$ connected to the node A is the sum of the capacitance of the capacitor 813 and the capacitance other than the capacitance of the capacitor 813.

$$Q_A=C_AV_A+\text{const}$$

The current $I_A$ of the node A is the time derivatives of electric charge flowing into the node A (or electric charge flowing from the node A); thus, the current $I_A$ of the node A is expressed by the following equation.

$$I_A \equiv \frac{\Delta Q_A}{\Delta t} = \frac{C_A \cdot \Delta F(Vout)}{\Delta t} \quad \text{[Formula 3]}$$

For example, Δt is about 54000 sec. The current $I_A$ of the node A can be calculated using the capacitance $C_A$ connected to the node A and the potential Vout of the output signal, and the leakage current of the circuit for characteristic evaluation can be accordingly obtained.

Next, the measurement results of the potential Vout of the output signal by the measurement method using the above circuit for characteristic evaluation are shown, and the value of the leakage current of the circuit for characteristic evaluation, which is calculated from the measurement results, is shown.

Figure 15:
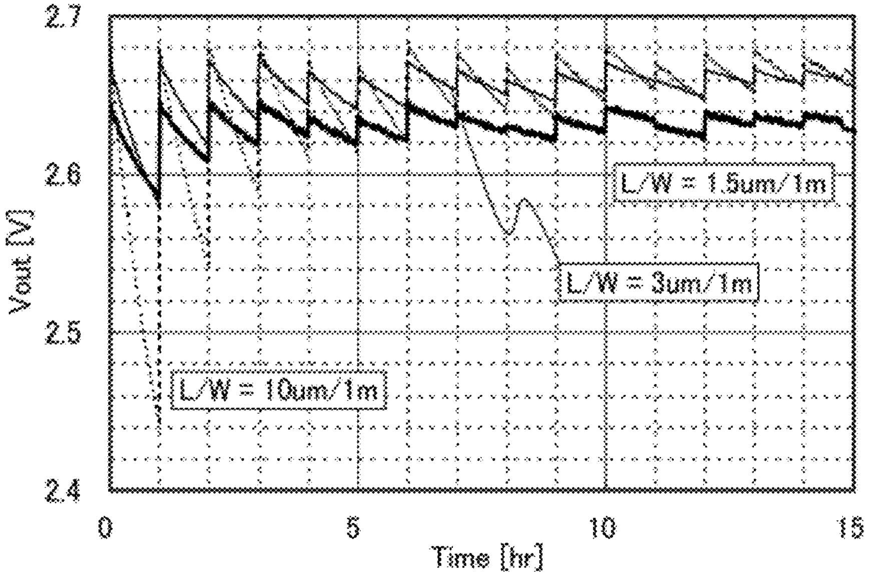
FIG. 15 shows a relation between the elapsed time and the potential of an output signal in a circuit for characteristic evaluation.
Figure 16:
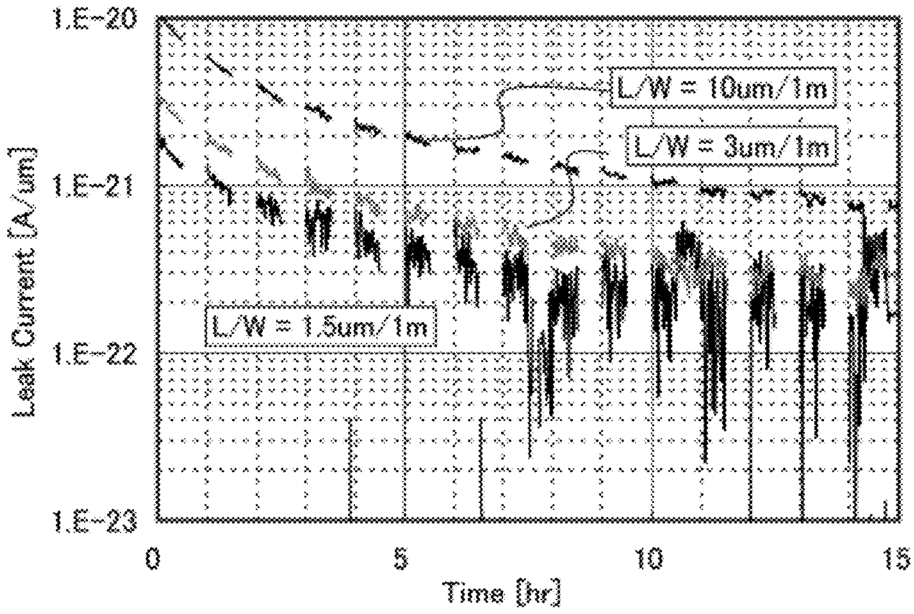
FIG. 16 shows a relation between the elapsed time and the leakage current calculated from measurement in a circuit for characteristic evaluation.

FIG. 15 shows a relation between the potential Vout of the output signal and the elapsed time Time in the measurement (the first accumulation and measurement operation) under Condition 1, Condition 2, and Condition 3 as an example. FIG. 16 shows a relation between the elapsed time Time in the measurement and the leakage current calculated from the measurement. It is found that the potential Vout of the output signal fluctuates after the start of the measurement and time required for obtaining the steady state is 10 hours or longer.

Figure 17:
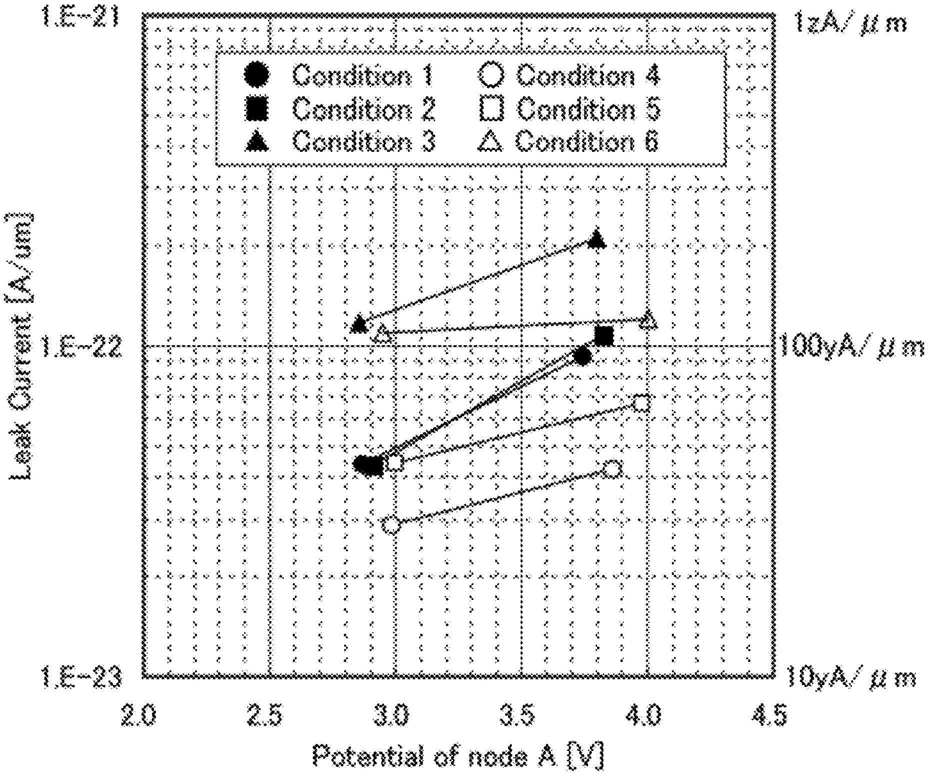
FIG. 17 shows a relation between the potential of a node A and the leakage current in a circuit for characteristic evaluation.

FIG. 17 shows a relation between the potential of the node A and the leakage current under Conditions 1 to 6, which was estimated from the measurement. In FIG. 17, in Condition 4 for example, the leakage current is 28 yA/μm when the potential of the node A is 3.0 V. Since the leakage current includes the off-state current of the transistor 812, the off-state current of the transistor 812 can be considered to be 28 yA/μm or lower.

As described above, the leakage current of the circuit for characteristic evaluation using a transistor including a highly purified oxide semiconductor layer serving as a channel formation layer is sufficiently low, which means that the off-state current of the transistor is sufficiently low.

By applying such a transistor to a startup circuit for a reference voltage generating circuit, like the startup circuits described in the above embodiments, voltage held in a storage node can be prevented from being affected by voltage drop due to leakage current of the transistor and the voltage can be held for a long time.

This embodiment can be implemented in an appropriate combination with any of the other embodiments described in this specification.

Example 1

In this example, calculation of the startup time which is a period from input of power to the time when the output voltage is stabilized, which was performed on a reference voltage generating circuit to which a conventional startup circuit is connected and a reference voltage generating circuit to which a startup circuit according to one embodiment of the present invention is connected, will be described. In addition, the comparison results will be shown.

Figure 11A:
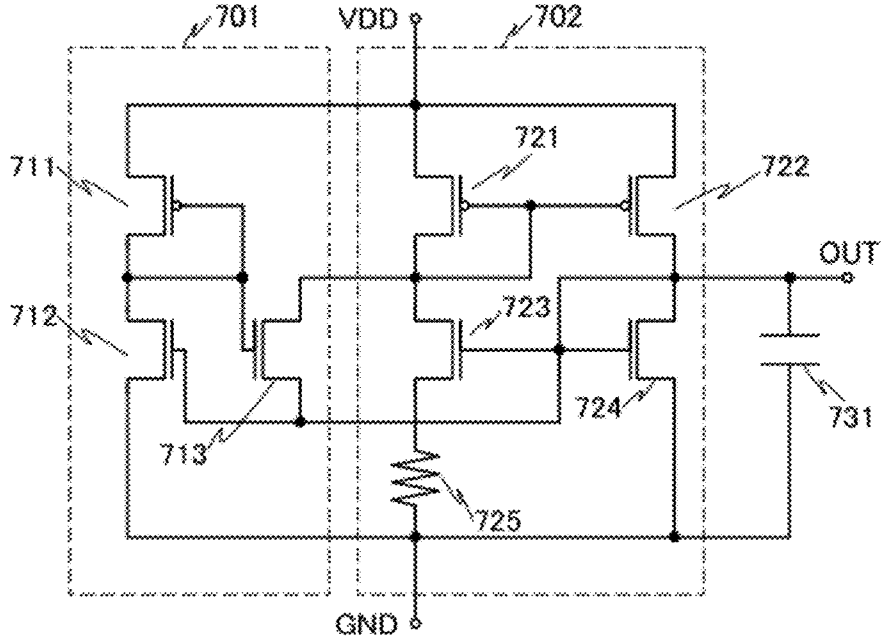
FIGS. 11A and 11B are diagrams of circuits used in Example 1 of the present invention.

FIG. 11A is a circuit diagram of a β multiplier self-bias reference voltage generating circuit to which a startup circuit 701 having a conventional configuration is connected, and calculation of this example was performed thereon. The startup circuit 701 has a configuration similar to that of the startup circuit 501 in FIG. 8 described in this specification and thus explanation thereof is omitted.

A reference voltage generating circuit 702 has the same configuration as the reference voltage generating circuit 302 described in Embodiment 4 and thus explanation thereof is omitted. Note that in this example, a load capacitor 731 with 10 pF is connected to the reference voltage generating circuit 702 as an output load.

Figure 11B:
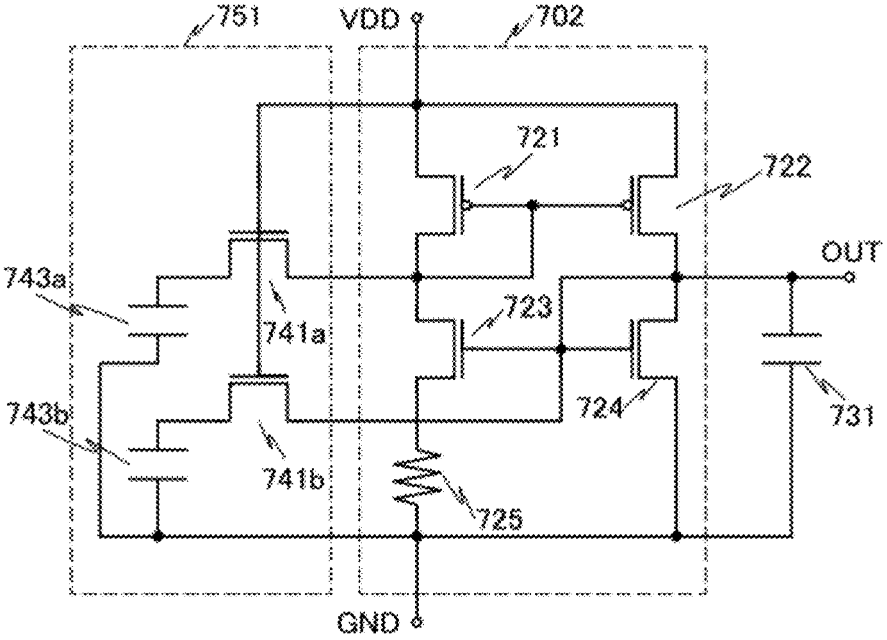

FIG. 11B is a circuit diagram illustrating a configuration in which a startup circuit 751 according to one embodiment of the present invention is connected to the reference voltage generating circuit 702, and calculation of this example was performed thereon. One of a source and a drain of each of two transistors (a transistor 741*a* and a transistor 741*b*) included in the startup circuit 751 is connected to a capacitor (a capacitor 743*a* or a capacitor 743*b*), whereby given voltage can be held in a node between the transistor and the capacitor. Gates of the two transistors are connected to the power input portion VDD, and the transistors are turned on or off depending on power supply voltage. Note that in this example, calculation was performed on the assumption that the capacitance of each of the two capacitors in the startup circuit 751 was 200 pF.

The reference voltage generating circuit 702 in FIG. 11A has the same configuration as that in FIG. 11B.

In this example, calculation was performed on the assumption that the threshold voltage of an n-channel transistor was 0.35 V and the threshold voltage of a p-channel transistor was −0.35 V.

Next, the calculation and the results thereof will be described.

With the use of the circuits illustrated in FIGS. 11A and 11B, the length of a period from the time when power supply voltage was applied to the power input portion VDD to the time when the voltage of an output portion OUT of the reference voltage generating circuit 702 was stabilized was calculated.

The power supply voltage of 1.7 V was applied to the power input portion VDD at time 5 μs, and the voltage of the output portion OUT before and after the application of the power supply voltage was calculated.

Note that calculation was performed on the circuit in FIG. 11B on the assumption that, before time 5 μs at which the power supply voltage was applied, the voltages of input nodes in a stable equilibrium state were held in advance in storage nodes connected to the transistor 741*a* and the transistor 741*b*. Specifically, a voltage of 1.29 V was held in the storage node connected to the transistor 741*a* in advance, and a voltage of 0.37 V was held in the storage node connected to the transistor 741*b* in advance.

Figure 12:
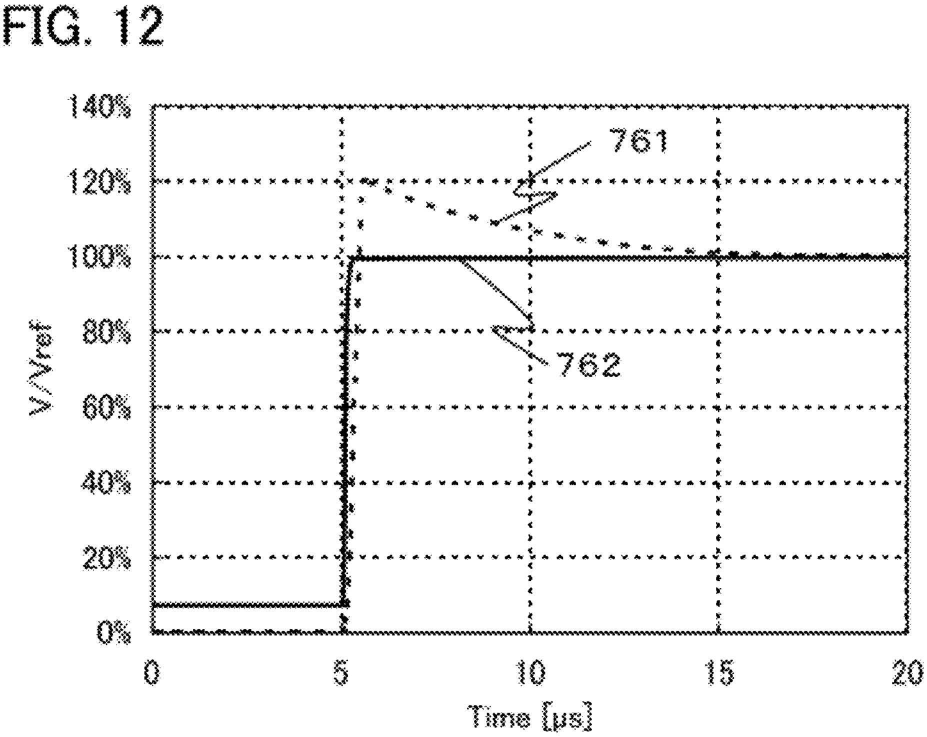
FIG. 12 shows a relation between the elapsed time and the output potential in Example 1 of the present invention.

FIG. 12 shows calculation results. For clarity, a value obtained by dividing the voltage of the output portion OUT at each time by voltage $V_{ref}$ which is voltage in a stable equilibrium state is used. In FIG. 12, the horizontal axis represents time and the vertical axis represents a value obtained by dividing the voltage of the output portion OUT by $V_{ref}$. In the graph, a curve 762 indicated by a solid line shows a calculation result in the case of using the configuration of one embodiment of the present invention in FIG. 11B, and a curve 761 indicated by a dashed line shows a calculation result in the case of using the conventional configuration in FIG. 11A.

From the curve 761 showing the calculation result of the conventional configuration, it is observed that the voltage gradually rises from time 5 μs at which power is input and then jumps to voltage that is approximately 120% of the voltage $V_{ref}$ which is voltage in a stable equilibrium state. After that, the voltage gradually decreases to the voltage $V_{ref}$ in a stable equilibrium state and reaches around the voltage in a stable equilibrium state at time 20 μs, which is about 15 μs after input of power.

On the other hand, from the curve 762 showing the calculation result of the configuration of one embodiment of the present invention, it is observed that the voltage is instantly raised to the voltage $V_{ref}$ which is voltage in a stable equilibrium state after time 5 μs is at which power is input and does not jump. The length of a period from input of power to the time when the reference voltage generating circuit reaches the stable equilibrium state is shorter than 1 μs, which is approximately one fifteenth of the result of the conventional configuration.

As described above, it can be confirmed that when a startup circuit in which voltage is held in a storage node between a transistor and a capacitor as in FIG. 11B is used, the startup time taken for a reference voltage generating circuit to reach a stable equilibrium state can be significantly shortened as compared to the case of using a conventional startup circuit.

This application is based on Japanese Patent Application serial no. 2010-189141 filed with the Japan Patent Office on Aug. 26, 2010, the entire contents of which are hereby incorporated by reference.

What is claimed is:

1. A semiconductor device comprising:

a startup circuit comprising:

a first transistor comprising a gate, a first terminal, and a second terminal;

a control circuit electrically connected to the gate of the first transistor; and a capacitor comprising a first electrode and a second electrode which is electrically connected to the first terminal of the first transistor; and a reference voltage generating circuit comprising a second transistor and a third transistor which comprise a gate, a first terminal and a second terminal, wherein a gate of the second transistor and the second terminal of the first transistor are electrically connected to a node, wherein the first terminal of the second transistor is electrically connected to the first terminal of the third transistor, wherein when the second terminal of the second transistor is supplied with a first voltage and the second terminal of the third transistor is supplied with a second voltage, the reference voltage generating circuit is configured to output from an output portion electrically connected to the first terminal of the second transistor and the first terminal of the third transistor a third voltage lower than the first voltage and higher than the second voltage, and wherein the first transistor comprises a channel formation region comprising an oxide semiconductor.

2. The semiconductor device according to claim 1, wherein the control circuit is configured to transmit a control signal to the gate of the first transistor.

3. The semiconductor device according to claim 1, wherein the output portion is electrically connected to a load circuit.

4. The semiconductor device according to claim 1, wherein the oxide semiconductor comprises at least one of indium and zinc.

5. The semiconductor device according to claim 1, wherein the oxide semiconductor comprises indium and zinc.

6. The semiconductor device according to claim 1, wherein the reference voltage generating circuit is a β multiplier self-bias reference voltage generating circuit.

7. The semiconductor device according to claim 1, further comprising a power input portion electrically connected to the control circuit.

8. The semiconductor device according to claim 1, wherein the reference voltage generating circuit further comprises a fourth transistor and a fifth transistor which comprise a gate, a first terminal and a second terminal, wherein the gate of the third transistor is electrically connected to the first terminal of the third transistor, wherein the gate of the fourth transistor is electrically connected to the gate of the second transistor, wherein the gate of the fifth transistor is electrically connected to the gate of the third transistor, wherein the first terminal of the fourth transistor is electrically connected to the first terminal of the fifth transistor, and wherein the gate of the fourth transistor is electrically connected to the first terminal of the fourth transistor.

9. A semiconductor device comprising:

a startup circuit comprising:

a first transistor comprising a gate, a first terminal, and a second terminal;

a second transistor comprising a gate, a first terminal, and a second terminal, the gate of the second transistor is electrically connected to the gate of the first transistor;

a control circuit electrically connected to the gate of the first transistor and the gate of the second transistor;

a first capacitor comprising a first electrode and a second electrode which is electrically connected to the first terminal of the first transistor; and a second capacitor comprising a first electrode and a second electrode which is electrically connected to the first terminal of the second transistor; and a reference voltage generating circuit comprising a third transistor and a fourth transistor which comprise a gate, a first terminal and a second terminal, wherein the second terminal of the first transistor is electrically connected to the gate of the third transistor, wherein the second terminal of the second transistor is electrically connected to the gate of the fourth transistor, wherein the first terminal of the third transistor is electrically connected to the first terminal of the fourth transistor, wherein when the second terminal of the third transistor is supplied with a first voltage and the second terminal of the fourth transistor is supplied with a second voltage, the reference voltage generating circuit is configured to output from an output portion electrically connected to the first terminal of the third transistor and the first terminal of the fourth transistor a third voltage lower than the first voltage and higher than the second voltage, and wherein each of the first transistor and the second transistor comprises a channel formation region comprising an oxide semiconductor.

10. The semiconductor device according to claim 9, further comprising a power input portion electrically connected to the control circuit.

11. The semiconductor device according to claim 9, wherein the control circuit is configured to transmit a control signal to the gate of the first transistor and the gate of the second transistor.

12. The semiconductor device according to claim 9, wherein the output portion is electrically connected to a load circuit.

13. The semiconductor device according to claim 9, wherein the oxide semiconductor comprises at least one of indium and zinc.

14. The semiconductor device according to claim 9, wherein the oxide semiconductor comprises indium and zinc.

15. The semiconductor device according to claim 9, wherein the reference voltage generating circuit is a β multiplier self-bias reference voltage generating circuit.

16. The semiconductor device according to claim 9, wherein the reference voltage generating circuit further comprises a fifth transistor and a sixth transistor which comprise a gate, a first terminal and a second terminal, wherein the gate of the fourth transistor is electrically connected to the first terminal of the fourth transistor, wherein the gate of the fifth transistor is electrically connected to the gate of the third transistor, wherein the gate of the sixth transistor is electrically connected to the gate of the fourth transistor, wherein the first terminal of the fifth transistor is electrically connected to the first terminal of the sixth transistor, and wherein the gate of the fifth transistor is electrically connected to the first terminal of the fifth transistor.

* * * * *